(12) United States Patent
Saito et al.

(10) Patent No.: US 8,072,219 B2
(45) Date of Patent: Dec. 6, 2011

(54) REGENERATIVE EXPANSION APPARATUS, PULSE TUBE CRYOGENIC COOLER, MAGNETIC RESONANCE IMAGING APPARATUS, NUCLEAR MAGNETIC RESONANCE APPARATUS, SUPERCONDUCTING QUANTUM INTERFERENCE DEVICE FLUX METER, AND MAGNETIC SHIELDING METHOD OF THE REGENERATIVE EXPANSION APPARATUS

(75) Inventors: Motokazu Saito, Tokyo (JP); Mingyo Xu, Tokyo (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 288 days.

(21) Appl. No.: 12/453,094

(22) Filed: Apr. 29, 2009

(65) Prior Publication Data
US 2009/0302844 A1    Dec. 10, 2009

(30) Foreign Application Priority Data
Jun. 9, 2008    (JP) .................................. 2008-151095

(51) Int. Cl.
*G01V 3/00*    (2006.01)
(52) U.S. Cl. ....................................... 324/318
(58) Field of Classification Search ........... 324/300–322
See application file for complete search history.

(56) References Cited

U.S. PATENT DOCUMENTS

| | | | | |
|---|---|---|---|---|
| 4,510,771 A * | 4/1985 | Matsuda et al. | ................ | 62/51.1 |
| 5,018,359 A * | 5/1991 | Horikawa et al. | ............... | 62/51.1 |
| 5,060,481 A * | 10/1991 | Bartlett et al. | ................ | 62/51.2 |
| RE33,878 E * | 4/1992 | Bartlett et al. | ................ | 62/47.1 |
| 5,381,666 A * | 1/1995 | Saho et al. | ........ | 62/47.1 |
| 5,449,416 A * | 9/1995 | Arai et al. | ........ | 148/301 |
| 5,590,533 A * | 1/1997 | Asami et al. | ........ | 62/6 |
| 6,332,324 B1 * | 12/2001 | Saho et al. | ........ | 62/51.1 |
| 6,378,312 B1 * | 4/2002 | Wang | ........ | 62/6 |
| 6,774,632 B2 * | 8/2004 | Kono | ........ | 324/318 |
| 6,967,482 B2 * | 11/2005 | Morita et al. | ........ | 324/322 |
| 7,053,619 B2 * | 5/2006 | Morita et al. | ........ | 324/318 |
| 7,084,635 B2 * | 8/2006 | Morita et al. | ........ | 324/322 |
| 7,218,115 B2 * | 5/2007 | Morita et al. | ........ | 324/322 |

(Continued)

FOREIGN PATENT DOCUMENTS
JP    02-123712 A    5/1990

(Continued)

OTHER PUBLICATIONS

JP Office Action, App. No. 2008-151095, Dec. 14, 2010 (2 pages).

(Continued)

*Primary Examiner* — Dixomara Vargas
(74) *Attorney, Agent, or Firm* — Rader, Fishman & Grauer PLLC

(57) ABSTRACT

A regenerative expansion apparatus includes a regenerative tube configured to regenerate cryogenic cooling at the time of expansion of a coolant gas; a cylinder in communication with a low temperature end of the regenerative tube, the cylinder being configured to generate the cryogenic cooling by repeating compression and expansion of the coolant gas via the regenerative tube; a magnetic cold storage material filling inside the regenerative tube, the magnetic cold storage material being made of a magnetic material, the magnetic cold storage material being configured to come in contact with the coolant gas so that the cryogenic cooling is regenerated; and a magnetic shield member surrounding the magnetic cold storage material; wherein the magnetic shield member has an electric resistivity equal to or less than 50 μΩcm at a normal temperature.

9 Claims, 10 Drawing Sheets

U.S. PATENT DOCUMENTS

| | | | |
|---|---|---|---|
| 7,219,501 B2 * | 5/2007 | Zia et al. | 62/6 |
| 7,318,318 B2 * | 1/2008 | Roth | 62/6 |
| 7,363,767 B2 * | 4/2008 | Wang | 62/6 |
| 2001/0032469 A1 | 10/2001 | Zhu et al. | |
| 2008/0173026 A1 | 7/2008 | Mita et al. | |

FOREIGN PATENT DOCUMENTS

| | | |
|---|---|---|
| JP | 02-161260 A | 6/1990 |
| JP | 05-332626 A | 12/1993 |
| JP | 2000-266417 A | 9/2000 |
| JP | 2001-280726 A | 10/2001 |
| JP | 2006-038446 A | 2/2006 |
| JP | 2007-095493 A | 4/2007 |
| JP | 2007-155319 A | 6/2007 |
| JP | 2007-333285 A | 12/2007 |
| JP | 2008-057924 A | 3/2008 |

OTHER PUBLICATIONS

JPO Office Action, App. No. 2008-151095, Mar. 9, 2010 (2 pages).

* cited by examiner

REGENERATIVE EXPANSION APPARATUS, PULSE TUBE CRYOGENIC COOLER, MAGNETIC RESONANCE IMAGING APPARATUS, NUCLEAR MAGNETIC RESONANCE APPARATUS, SUPERCONDUCTING QUANTUM INTERFERENCE DEVICE FLUX METER, AND MAGNETIC SHIELDING METHOD OF THE REGENERATIVE EXPANSION APPARATUS

CROSS-REFERENCE TO RELATED APPLICATIONS

This patent application is based upon and claims the benefit of priority of Japanese Patent Application No. 2008-151095 filed on Jun. 9, 2008, the entire contents of which are incorporated herein by reference.

BACKGROUND OF THE INVENTION

1. Field of the Invention

The present invention generally relates to regenerative expansion apparatuses, pulse tube cryogenic coolers, magnetic resonance imaging apparatuses, nuclear magnetic resonance apparatuses, superconducting quantum interference device flux meters, and magnetic shielding methods of the regenerative expansion apparatuses.

More specifically, the present invention relates to a regenerative expansion apparatus configured to shield the magnetic field change due to a magnetic cold storage material, a pulse tube cryogenic cooler, a magnetic resonance imaging apparatus, a nuclear magnetic resonance apparatus, a superconducting quantum interference device flux meter, and a magnetic shielding method of the regenerative expansion apparatus.

2. Description of the Related Art

In recent years, in a system having a superconducting magnet such as a Magnetic Resonance Imaging (MRI) apparatus, a cryogenic cooler has been used so that the superconducting magnet is cooled at a cryogenic temperature. As the cryogenic cooler, for example, a cooler such as a Gifford McMahon (GM) cryogenic cooler or a pulse tube cryogenic cooler has been used. These coolers are regenerative cryogenic coolers configured to perform adiabatic expansion of coolant gas so that cryogenic cooling is generated at that time, and to regenerate the cryogenic cooling of a cold storage material.

The regenerative cryogenic cooler includes a regenerative expansion apparatus and a compressor. The regenerative expansion apparatus is configured to regenerate cryogenic cooling, the cryogenic cooling being generated at the time of the adiabatic expansion of coolant gas. The compressor is configured to receive the coolant gas from the regenerative expansion apparatus, compress the received coolant gas, and resupply the compressed coolant gas to the regenerative expansion apparatus.

The regenerative expansion apparatus includes a cold storage material to be cryogenically cooled. It is necessary for the cold storage material to have a high specific heat at a cryogenic temperature which is the temperature to be used. However, in general, the specific heat of a metal such as lead drastically decreases at cryogenic temperatures equal to or lower than 15 K as the temperature is decreased. Inversely, the specific heat of helium being used as the coolant gas increases as the temperature is decreased.

Accordingly, it is not possible to sufficiently transfer heat from the cold storage material by helium gas cooled by adiabatic expansion. Hence, the temperature of the regenerative expansion apparatus cannot reach the cryogenic temperature such as 4.2 K.

Because of this, in order to make the temperature of the regenerative expansion apparatus reach the cryogenic temperature, a magnetic cold storage material such as $HoCu_2$ is used as the cold storage material. This magnetic cold storage material has a specific heat greater than that of lead at a temperature equal to or less than 15 K. At the temperature equal to or less than 15 K, the magnetic cold storage material undergoes phase transition so that the magnetic cold storage material becomes antiferromagnetic. The antiferromagnetic magnetic cold storage material compared to lead or the like has a large magnetic susceptibility.

Therefore, if the magnetic cold storage material moves in a magnetic field such as one accompanying operations of the regenerative cryogenic cooler, the magnetic field changes in the vicinity of the regenerative cryogenic cooler. For example, in a case where the regenerative cryogenic cooler is arranged close to the superconducting magnet, the magnetic cold storage material included in the regenerative cryogenic cooler is magnetized due to the magnetic field generated by the superconducting magnet and the magnetized magnetic cold storage material moves in the magnetic field generated by the superconducting magnet. Therefore, the magnetic field generated by the superconducting magnet is disarranged.

Because of this, the following method has been suggested. That is, the magnetic field generated by the magnetic cold storage material included in the regenerative expansion apparatus is shielded by using a superconducting magnetic shield member.

An example of a GM cryogenic cooler where an alloy or a chemical compound using a rare earth metal is used as the magnetic cold storage material and a magnetic shield member made of a superconductor is provided in the periphery of the magnetic cold storage material is described in Japanese Laid-Open Patent Application Publication No. 2-161260. In this example, the magnetic cold storage material fills a displacer which is a movable part of the GM cryogenic cooler. A superconducting magnetic shield part is provided in the periphery of the displacer that the magnetic cold storage material fills.

On the other hand, the pulse tube cryogenic cooler does not include a movable part such as the displacer of the GM cryogenic cooler. Therefore, in the pulse tube cryogenic cooler compared to other coolers such as the GM cryogenic cooler, the moving distance of the magnetic cold storage material is short and the disturbance of the magnetic field is small. Because of this, the pulse tube cryogenic cooler is advantageous in a system having a superconducting magnet.

However, in a case where the pulse tube cryogenic cooler is used for a micro-magnetic field measuring system configured for a micro-magnetic field, such as for MRI, even the micro-magnetic field change due to micro-vibration of the pulse tube cryogenic cooler causes disturbance of the magnetic field. Accordingly, in the case where the pulse tube cryogenic cooler is used for the micro-magnetic field measuring system, a superconducting magnetic shield member is provided for the pulse tube cryogenic cooler.

An example where the superconducting magnetic shield member is provided for the pulse tube cryogenic cooler is discussed with reference to FIG. 1. Here, FIG. 1 is a schematic view of a related art regenerative expansion apparatus for the pulse tube cryogenic cooler.

As shown in FIG. 1, a regenerative expansion apparatus 110 includes a first regenerative tube 111, a second regenerative tube 112, a first pulse tube 113, a second pulse tube 114, a first stage cooling stage 115, a second stage cooling stage 116, a flange 117, a valve unit 118, a cold storage material 122, a magnetic cold storage material 123, and a superconducting magnetic shield member 127.

The flange 117 is an original point (starting point) of a high temperature side. The first stage cooling stage 115 and the second stage cooling stage 116 are provided with separation. The first regenerative tube 111 and the first pulse tube 113 are provided between the flange 117 and the first stage cooling stage 115. The second regenerative tube 112 is provided between the first stage cooling stage 115 and the second stage cooling stage 116. The second pulse tube 114 is provided between the flange 117 and the second stage cooling stage 116.

The cold storage material 122 and the magnetic cold storage material 123 fill, in this order, from the first stage cold stage 115 to the second regenerative tube 112 along a direction to the second stage cold stage 116. The superconducting magnetic shield member 127 surrounds a part of the second regenerative tube 112 that the magnetic cold storage material 123 fills and thermally comes in contact with the second stage cooling stage 116. The lower end of the superconducting magnetic shield member 127 is fixed to the second stage cooling stage 116 by solder.

The temperature of the first stage cooling stage 115 is maintained at approximately 20 K through approximately 100 K. The temperature of the second stage cooling stage 116 is maintained at approximately 4 K through approximately 10 K. Since the lower end of the superconducting magnetic shield member 127 comes in thermal contact with the second stage cooling stage 116, the temperature of the superconducting magnetic shield member 127 is maintained substantially the same as the temperature of the second stage cooling stage 116.

In addition, in a case where the regenerative expansion apparatus 110 cools liquid helium in a low temperature vessel, a part below the flange 117 is filled with helium gas where the liquid helium is evaporated.

In the meantime, an example of a pulse tube cryogenic cooler having a regenerative expansion apparatus having a superconducting magnetic shield member is described in Japanese Laid-Open Patent Application Publication No. 2007-155319.

In addition, an example of a pulse tube cryogenic cooler provided in a superconducting magnetic system, where the pulse tube cryogenic cooler is filled with the magnetic cold storage material, is described in Japanese Laid-Open Patent Application Publication No. 2006-38446. In this pulse tube cryogenic cooler, a superconducting magnetic shield member is provided so that a stray magnetic field due to the magnetic cold storage material is reduced.

However, in the case of a magnetic field change due to the magnetic cold storage material of a regenerative cryogenic cooler having the regenerative expansion apparatus where the cold storage material is shielded by using the superconducting magnetic shield member, the following problems may occur.

In any methods described in Japanese Laid-Open Patent Application Publication No. 2-161260, Japanese Laid-Open Patent Application Publication No. 2007-155319, and Japanese Laid-Open Patent Application Publication No. 2006-38446, in order to maintain a superconducting state of the superconducting magnetic shield member, the superconducting magnetic shield member has to be cooled at a temperature equal to or lower than a superconducting critical temperature.

However, as shown in FIG. 1, for example, the second regenerative tube 122, filled by the magnetic cold storage material 123 where the superconducting magnetic shield member 127 shields the magnetic field, is arranged between the first stage cold stage 115 and the second stage cold stage 116. Accordingly, the second regenerative tube 112 is in a range whose temperatures are approximately 4 K through approximately 10 K. On the other hand, helium gas is situated between the superconducting magnetic shield member 127 and the second regenerative tube 112. Hence, the temperature of the superconducting magnetic shield member 127 increases due to heat transfer via helium gas so that the temperature of the second stage cold stage 116 which thermally comes in contact with the superconducting magnetic shield member 127 increases.

As a result of this, the cryogenic cooling capacity of the cryogenic cooler is degraded so that a designated cryogenic temperature cannot be achieved.

SUMMARY OF THE INVENTION

Accordingly, embodiments of the present invention may provide a novel and useful regenerative expansion apparatus, pulse tube cryogenic cooler, magnetic resonance imaging apparatus, nuclear magnetic resonance apparatus, superconducting quantum interference device flux meter, and magnetic shielding method of the regenerative expansion apparatus, solving one or more of the problems discussed above.

More specifically, the embodiments of the present invention may provide a regenerative expansion apparatus having a magnetic cold storage material in a regenerative cryogenic cooler whereby a magnetic field change due to the magnetic cold storage material can be shielded without causing degradation of the cryogenic cooling capacity of the cryogenic cooler, a pulse tube cryogenic cooler, a magnetic resonance imaging apparatus, a nuclear magnetic resonance apparatus, a superconducting quantum interference device flux meter, and a magnetic shielding method of the regenerative expansion apparatus.

One aspect of the present invention may be to provide a regenerative expansion apparatus, including:

a regenerative tube configured to regenerate cryogenic cooling at the time of expansion of a coolant gas;

a cylinder in communication with a low temperature end of the regenerative tube, the cylinder being configured to generate the cryogenic cooling by repeating compression and expansion of the coolant gas via the regenerative tube;

a magnetic cold storage material filling inside the regenerative tube, the magnetic cold storage material being made of a magnetic material, the magnetic cold storage material being configured to come in contact with the coolant gas so that the cryogenic cooling is regenerated; and a magnetic shield member surrounding the magnetic cold storage material;

wherein the magnetic shield member has an electric resistivity equal to or less than 50 µΩcm at a normal temperature.

Another aspect of the present invention may be to provide a magnetic shielding method of a regenerative expansion apparatus having a magnetic cold storage material, the method including:

a step of flowing a shield electric current through an electric conductance material having an electric resistivity equal to or less than 50 µΩcm at a normal temperature by surrounding the magnetic cold storage material with the electric conductance material so that a magnetic field generated by the magnetic cold storage material is changed and shielded.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 2 through FIG. 10 of embodiments of the present invention.

First Embodiment

Figure 1:
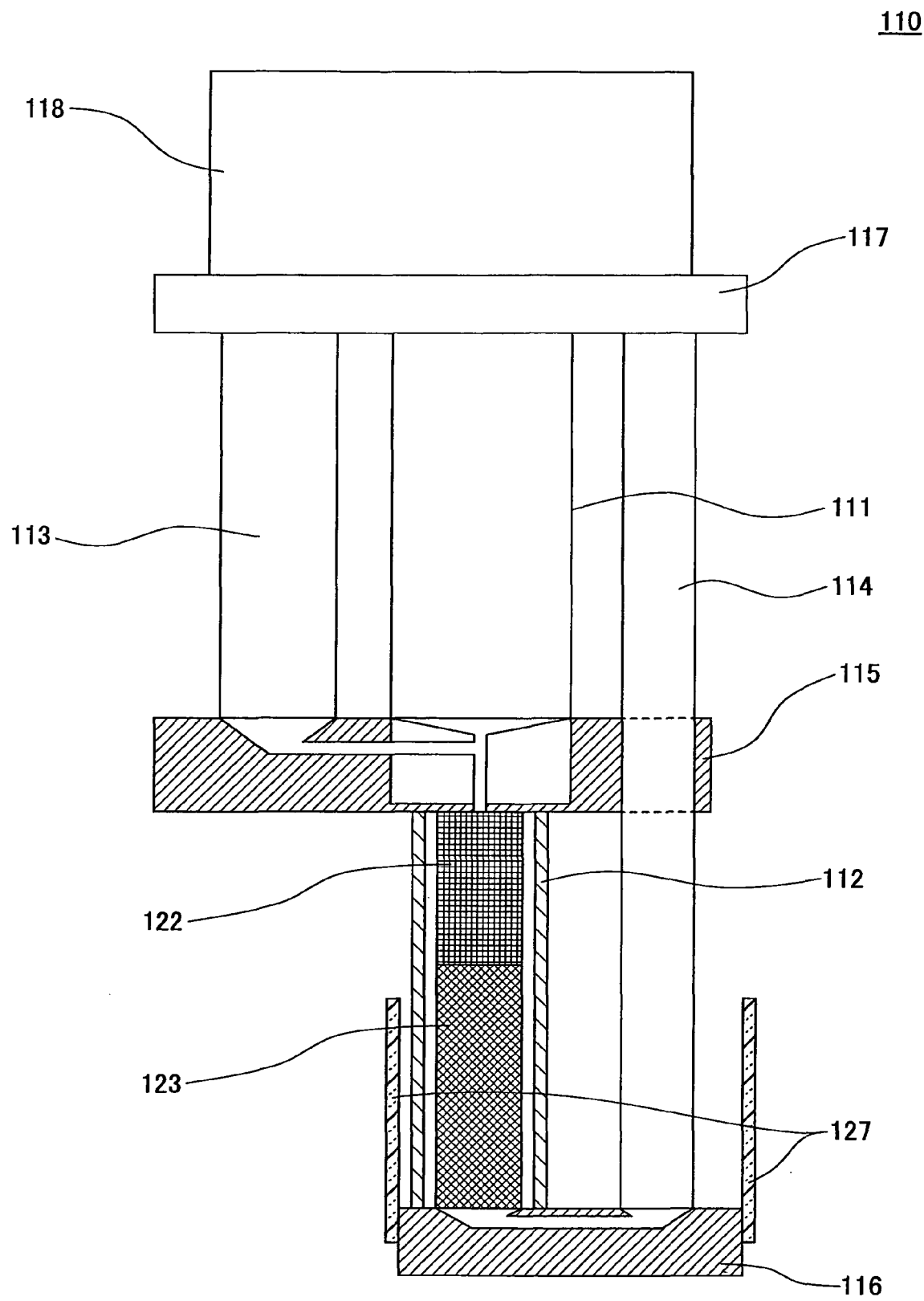
FIG. 1 is a schematic view of a structure of a related art regenerative expansion apparatus.
Figure 2:
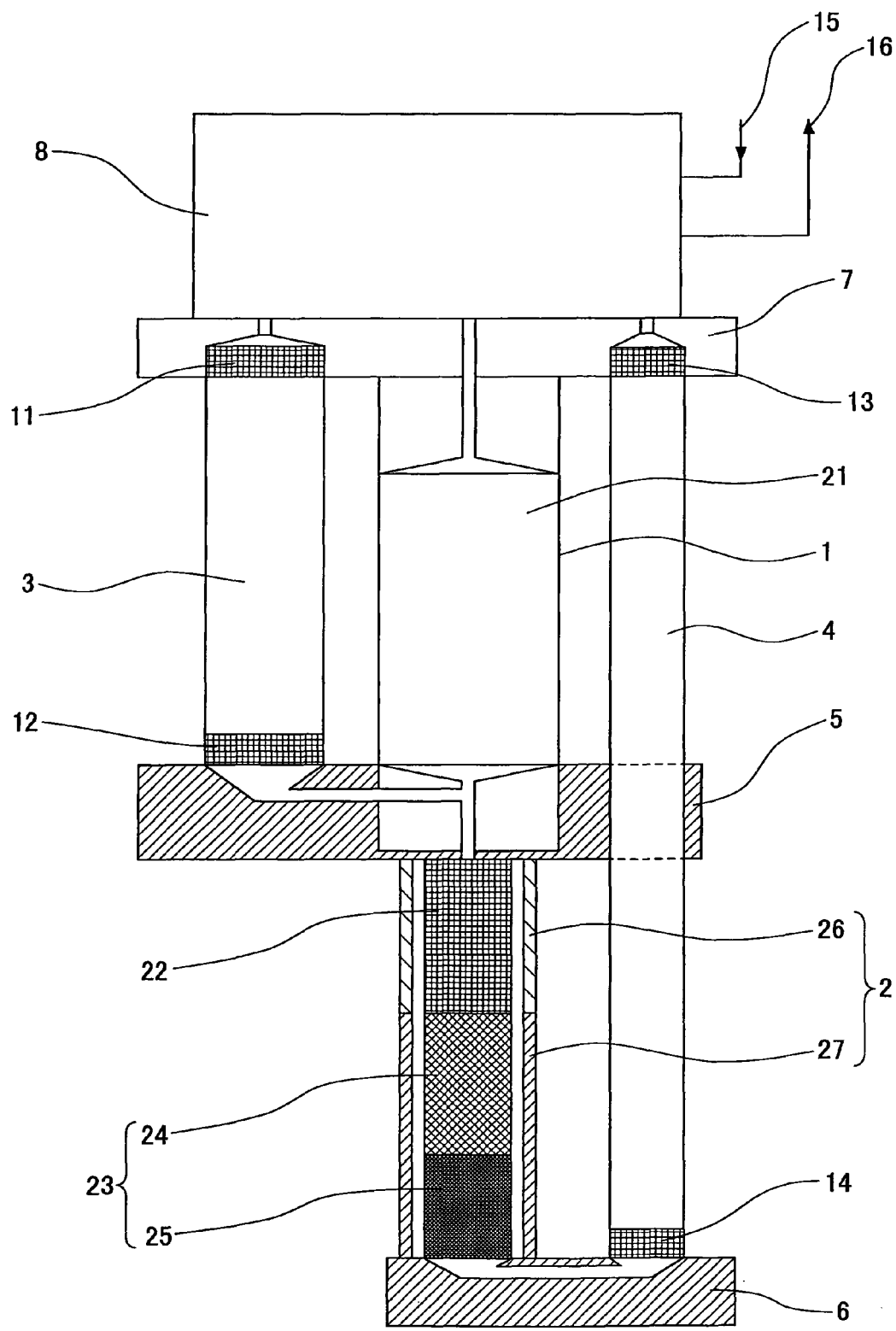
FIG. 2 is a schematic view of a structure of a regenerative expansion apparatus of a first embodiment of the present invention.

With reference to FIG. 2, a regenerative expansion apparatus of a first embodiment of the present invention is discussed.

Here, FIG. 2 is a schematic view of a structure of the regenerative expansion apparatus of the first embodiment of the present invention.

As shown in FIG. 2, a regenerative expansion apparatus 10 of this embodiment includes a first regenerative tube 1, a second regenerative tube 2, a first pulse tube 3, a second pulse tube 4, a first stage cold stage 5, a second stage cold stage 6, a flange 7, and a valve/orifice/buffer unit 8. In the regenerative expansion apparatus 10 of this embodiment, the regenerative tube and the pulse tube have two-stage structures.

Accordingly, from a high temperature end to a lower temperature end, the flange 7, the first stage cold stage 5, and the second stage cold stage 6 are provided with separation. In addition, the first regenerative tube 1, the second regenerative tube 2, the first pulse tube 3, and the second pulse tube 4 are provided so as to connect the flange 7, the first stage cold stage 5, and the second stage cold stage 6 to each other.

The first regenerative tube 1 and the second regenerative tube 2 are provided at a first stage and a second stage, respectively, where the flange 7 is an origin (starting point). The first regenerative tube 1 and the second regenerative tube 2 regenerate cryogenic cooling by repeating adiabatic expansion of helium gas as the coolant gas.

One end of the first regenerative tube 1 is fixed to the flange 7. Another end of the first regenerative tube 1 is fixed to the first stage cold stage 5. A flange 7 end of the first regenerative tube 1 is a high temperature end. A first stage cold stage 5 end of the first regenerative tube 1 is a low temperature end. Furthermore, one end of the second regenerative tube 2 is fixed to the first stage cold stage 5. Another end of the second regenerative tube 2 is fixed to the second stage cold stage 6. A first stage cold stage 5 end of the second regenerative tube 2 is a high temperature end. A second stage cold stage 6 end of the second regenerative tube 2 is a low temperature end.

The first pulse tube 3 and the second pulse tube 4 are provided at a first stage and a second stage where the flange 7 is an origin (starting point). The first pulse tube 3 and the second pulse tube 4 generate cryogenic cooling by repeating adiabatic expansion of helium gas as the coolant gas supplied via the first regenerative tube 1 and the second regenerative tube 2.

One end of the first pulse tube 3 is fixed to the flange 7. Another end of the first pulse tube 3 is fixed to the first stage cold stage 5. A flange 7 end of the first pulse tube 3 is a high temperature end. A first stage cold stage 5 end of the first pulse tube 3 is a low temperature end. Furthermore, one end of the second pulse tube 4 is fixed to the flange 7. Another end of the second pulse tube 4 is fixed to the second stage cold stage 6. A flange 7 end of the second pulse tube 4 is a high temperature end. A second stage cold stage 6 end of the second pulse tube 4 is a low temperature end.

A rectifier 11 is provided at a high temperature end of the first pulse tube 3. A rectifier 12 is provided at a low temperature end of the first pulse tube 3. A rectifier 13 is provided at a high temperature end of the second pulse tube 4. A rectifier 14 is provided at a low temperature end of the second pulse tube 4. The rectifiers 11, 12, 13, and 14 are configured to stabilize the flow of the coolant gas accompanying the supply or receipt of the coolant gas in the first pulse tube 3 and the second pulse tube 4.

A low temperature end of the first regenerative tube 1 and a low temperature end of the first pulse tube 3 are fixed to the first stage cold stage 5. Cryogenic cooling is conducted in the first regenerative tube 1 to transfer heat from the first stage cold stage 5 so that the first stage cold stage 5 is maintained at a low temperature.

In addition, a high temperature end of the second regenerative tube 2 is fixed to the first stage cold stage 5. The first stage cold stage 5 functions as a buffer configured to prevent conduction of heat to the second regenerative tube 2 from the high temperature end. Although there is no limitation of reached temperature of the first stage cold stage 5, the reached temperature of the first stage cold stage 5 may be, for example, approximately 40 K.

A low temperature end of the second regenerative tube 2 and a low temperature end of the second pulse tube 4 are fixed to the second stage cold stage 6. Cryogenic cooling is conducted in the second regenerative tube 2 to remove heat from the second stage cold stage 6 while the first stage cold stage 5 having a maintained low temperature of approximately 40 K is used as a buffer, so that the temperature of the second stage cold stage 6 is maintained at a low temperature. Although there is no limitation of reached temperature of the second stage cold stage 6, the reached temperature of the second stage cold stage 6 may be, for example, approximately 4 K.

The inside of the low temperature end of the first regenerative tube 1 is in communication with the inside of the low temperature end of the first pulse tube 3 and the inside of the high temperature end of the second regenerative tube 2 via a pipe provided inside the first stage cold stage 5. The inside of the low temperature end of the second regenerative tube 2 is in communication with the inside of the low temperature end of the second pulse tube 4 via a pipe provided inside the second stage cold stage 6.

The valve/orifice/buffer unit 8 is provided at a side of the flange 7 opposite to the first regenerative tube 1, the first pulse tube 3, and the second pulse tube 4. The inside of the high temperature end of the first regenerative tube 1, the inside of the high temperature end of the first pulse tube 3, and the inside of the high temperature end of the second pulse tube 4 are connected to a supply pipe 15 configured to supply the coolant gas from an outside compressor and a receiving pipe 16 configured to receive the expanded coolant gas and return it to the outside compressor via a pipe provided inside the flange 7 and a pipe provide inside the valve/orifice/buffer unit 8.

A first cold storage material 21 fills the inside of the first regenerative tube 1. A copper mesh (copper wire processed into a mesh), for example, can be used as the first cold storage material 21. In addition, in order to make conductive heat loss in an axial direction minimum, a thin SUS material can be used for the first regenerative tube 1. A material such as SUS 304 can be used as the SUS material.

A second cold storage material 22 and the magnetic cold storage material 23 fill the inside of the second regenerative tube 2 in this order from the high temperature end to the low temperature end. Lead balls, for example, can be used for the second cold storage material 22. This is because lead among metals has a high specific heat in a temperature range of approximately 15 K through approximately 40 K.

The magnetic cold storage material 23 includes a first magnetic cold storage material 24 and a second magnetic cold storage material 25, in this order, from the high temperature end to the low temperature end of the second regenerative tube 2.

As the first magnetic cold storage material 24, $Er_3Ni$ having a high specific heat in the temperature range of, for example, approximately 10 K through approximately 15 K can be used. For example, spherical-shaped $Er_3Ni$ balls having a diameter of approximately 0.2 mm can partially fill the second regenerative tube 2. As the second magnetic cold storage material 25, $HoCu_2$ having a high specific heat in the temperature range of, for example, approximately 5 K through approximately 10 K can be used. For example, spherical-shaped $HoCu_2$ balls having a diameter of approximately 0.2 mm can partially fill the second regenerative tube 2.

The same material, such as ErNi, can be used for the first magnetic cold storage material 24 and the second magnetic cold storage material 25. In this case, the first magnetic cold storage material 24 and the second magnetic cold storage material 25 form the magnetic cold storage material 23 in a body.

The second regenerative tube 2 includes a second regenerative tube member 26 and a magnetic shield member 27.

The second regenerative tube member 26 is a part at a high temperature end of the second regenerative tube 2 including a part that the second cold storage material 22 fills. The second regenerative tube 2, as well as the first regenerative tube 1, is made of a thin SUS material such as SUS 304 so that the heat conductance loss in the axial direction can be made minimum. A cross section perpendicular to the axial direction of the second regenerative tube member 26 has, for example, an external diameter of approximately 35 mm, an internal diameter of approximately 30 mm, and a wall thickness of approximately 2.5 mm.

The magnetic shield member 27 is a part at a low temperature end of the second regenerative tube 2 including a part that the first magnetic cold storage material 24 and the second magnetic cold storage material 25 fill. The magnetic shield member 27 is made of an electric conductor including, for example, aluminum material or a copper material such as oxygen-free copper. The magnetic shield member 27 is configured to shield the magnetic field change generated by the first magnetic cold storage material 24 and the second magnetic cold storage material 25. A cross section perpendicular to the axial direction of the magnetic shield member 27 has, for example, an external diameter of approximately 35 mm, an internal diameter of approximately 30 mm, and a wall thickness of approximately 2.5 mm.

The second regenerative tube member 26 and the magnetic shield member 27 are connected to each other by, for example, a connecting method for screw-fixing one to another, a connecting method using a joint, a connecting method using welding, or the like.

Next, an action of the regenerative expansion apparatus 10 for cryogenic cooling, an action of the magnetic cold storage material 23 for generating the magnetic field change, and an action of the magnetic shield member 27 for shielding the magnetic field change in this embodiment, are discussed.

First, the action of the regenerative expansion apparatus 10 for cryogenic cooling is discussed.

The regenerative expansion apparatus 10 switches communication of the high temperature end of the first regenerative tube 1 to the supply pipe 15 or the receiving pipe 16 via the valve/orifice/buffer unit 8. The coolant gas repeats compression and expansion within the first pulse tube 3. Cryogenic cooling generated by adiabatic expansion at this time is regenerated for the first cold storage material 21 filling the first regenerative tube 1 so that the first stage cold stage 5 is cooled at, for example, approximately 40 K.

Since the regenerative expansion apparatus 10 has a two stage structure, the coolant gas introduced from the valve/orifice/buffer unit 8 to the first regenerative tube 1 is introduced from the low temperature end of the first regenerative tube 1 to the high temperature end of the second regenerative tube 2.

In addition, the coolant gas reaches the low temperature end of the second regenerative tube 2. The coolant gas repeats compression and expansion within the second pulse tube 4. Cryogenic cooling generated by adiabatic expansion at this time is regenerated in the magnetic cold storage material 23 and the second cold storage material 22 filling the second regenerative tube 2 so that the second stage cold stage 6 is cooled. Since compression and expansion of the coolant gas cooled at, for example, approximately 40 K is repeated by the first pulse tube 3, the second stage cold stage 6 is cooled at, for example, approximately 4 K.

Next, the action of the magnetic cold storage material 23 for generating the magnetic field change is discussed.

The repeating speed for switching the supply pipe 15 and the receiving pipe 16 and the repeating speed for repeating compression and expansion of the coolant gas in the first pulse tube 3 and the second pulse tube 4 are, for example, approximately 2 Hz. Accompanying the compression and expansion, stretching vibration of the second pulse tube 4 occurs in the axial direction at the same repeating speed.

Based on this, stretching vibrations in the axial direction of the second stage cooling stage 6 and the second regenerative tube 2 occur so that the stretching vibration of the magnetic cold storage material 22 occurs in the axial direction of the second regenerative tube 2. The periodic amplitude of vibration of the magnetic cold storage material 23 is, for example, approximately 10 μm. Based on this stretching vibration, the magnetic field change is generated around the magnetic cold storage material 23 at the same repeating speed.

Due to heat exchange with the coolant gas, the temperature of the magnetic cold storage material 23 is minutely changed. Since a magnetic susceptibility of the magnetic cold storage material 23 has temperature dependency, the magnetization of the magnetic cold storage material 23 is changed due to change of temperature. Accordingly, the magnetic field is changed at the same repeating speed by even the change of the temperature.

Next, the action of the magnetic shield member 27 for shielding the magnetic field change is discussed.

The magnetic shield member 27 is made of an electric conductor including, for example, aluminum material or a copper material such as oxygen-free copper. Therefore, when the magnetic field change is generated, because of Lentz's law (which is the same as Faraday's law of electromagnetic induction), the shield electrical current flows in the magnetic shield member 27 so that the direction of the magnetic field generated by the magnetic field change is cancelled. As a result of this, the magnetic field change can be shielded.

Here, by using Faraday's law of electromagnetic induction (rotE=−∂B/∂t where "E" denotes the electric field; "B" denotes the magnetic field; and "t" denotes a time) and expression "$B_1 \propto nI$" indicating the magnetic field $B_1$ generated by an unlimited solenoid when an electrical current I flows to the unlimited solenoid having n windings per unit length, the magnetic field $B_2$ generated by Lentz's law is calculated as follows.

$$B_2 \propto (d/\rho) \cdot (\Delta B_1 / \Delta t)$$

Here, "$\rho$" denotes an electric resistivity of the electric conductance material; "d" denotes a thickness of the magnetic shield member 27; "$\Delta B_1$" denotes the magnetic field change during time $\Delta t$.

Thus, "$B_2$" is proportional to "d" and is inversely proportional to "$\rho$". Accordingly, the magnetic shield 27 is formed by using the electric conductance material where the electric resistivity $\rho$ is low and the thickness "d" of the magnetic shield member 27 is made large, and thereby the magnetic field change generated by the magnetic cold storage material 23 can be shielded.

A material having the electric resistivity $\rho$ smaller than that of stainless which is a material of the second regenerative tube member 26 (for example, an electric resistivity $\rho$ of SUS 304=72 μΩcm) and equal to or less than 50 μΩcm, among metal having an electric resistivity $\rho$ (equal to or less than $10^{-3}$ Ωcm) smaller than those of insulators (equal to or greater than $10^{12}$ Ωcm) and semiconductors ($10^{-3}$ Ωcm through $10^{12}$ Ωcm), can be used as the magnetic shield member 27 which has the electric conductance.

As the magnetic shield member 27, for example, copper (2 μΩcm), aluminum (3 μΩcm), or the like can be used. Oxygen-free copper or the like can be used as the copper material.

If the thickness "d" of the magnetic shield member 27 is too large, the cryogenic cooling capacity of the cryogenic cooler is degraded due to heat conductance between the first stage cold stage 5 and the second stage cold stage 6. Therefore, for example, the thickness "d" of the magnetic shield member 27 can be 2.5 mm. By selecting 2.5 mm as the thickness of the magnetic shield member 27, it is possible to shield the magnetic field generated by the magnetic cold storage material 23 and therefore the temperature of the second stage cold stage 6 can be maintained at approximately 4 K.

Thus, according to the regenerative expansion apparatus of the embodiment of the present invention, the magnetic field change generated by the magnetic cold storage material is shielded by the magnetic shield member using the electric conductance material. Accordingly, in this embodiment compared to a case where the magnetic field change is shielded by the superconducting magnetic shield member, there is no loss of cryogenic cooling due to cooling the superconducting magnetic shield member so that it is possible to prevent degradation of the cryogenic cooling capacity of the cryogenic cooler having the regenerative expansion apparatus.

First Modified Example of the First Embodiment

Next, a regenerative expansion apparatus of a first modified example of the first embodiment of the present invention is discussed with reference to FIG. 3.

Figure 3:
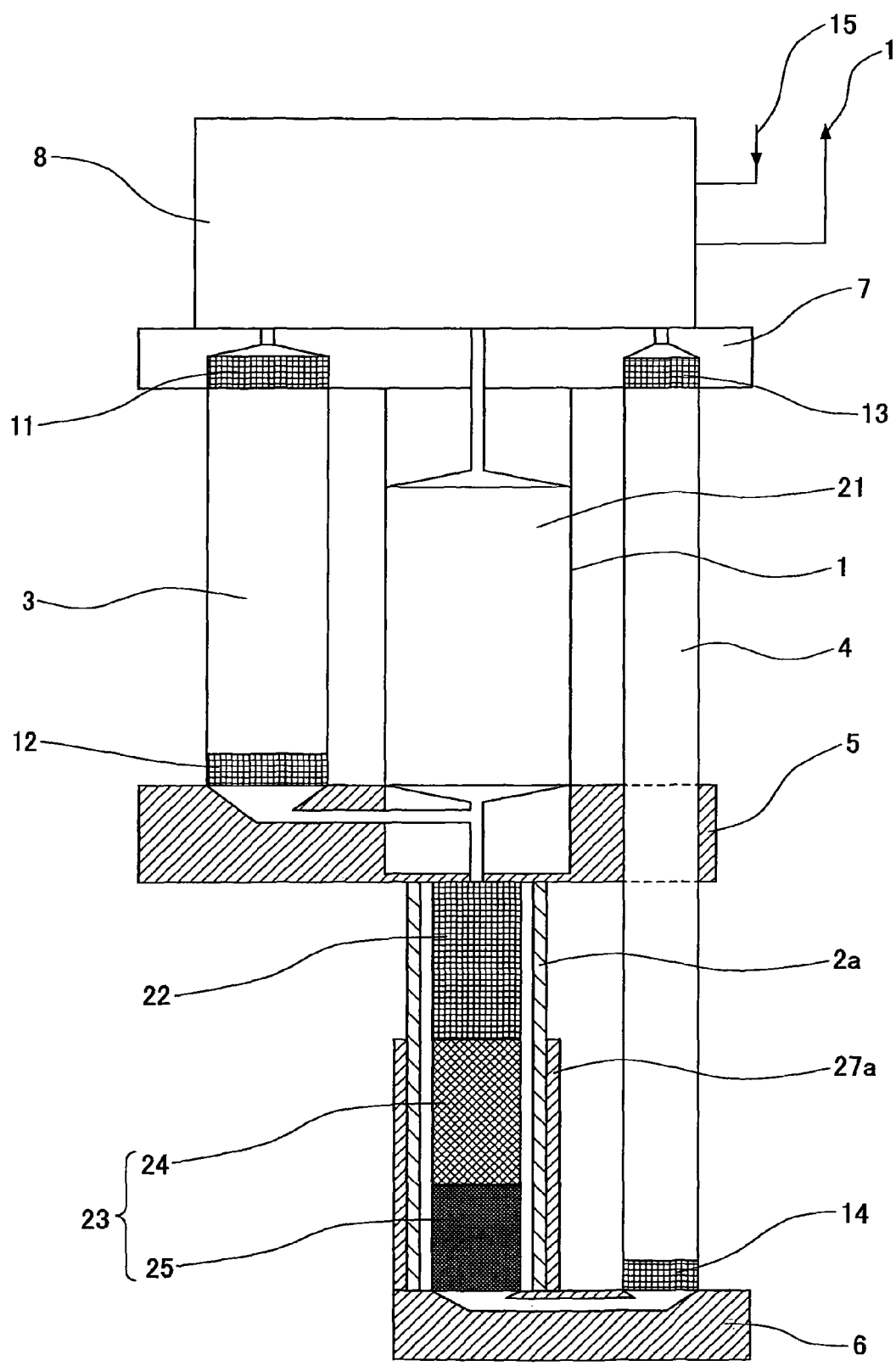
FIG. 3 is a schematic view of a structure of a regenerative expansion apparatus of a first modified example of the first embodiment of the present invention.

FIG. 3 is a schematic view of a structure of a regenerative expansion apparatus of a first modified example of the first embodiment of the present invention. In FIG. 3 as well as FIG. 4 through FIG. 10, parts that are the same as the parts previously shown are given the same reference numerals, and explanation thereof is omitted.

The regenerative expansion apparatus of this modified example is different from that of the first embodiment in that the magnetic shield member using the electric conductance material comes in contact with and is provided so as to surround a part that the magnetic cold storage material of the second regenerative tube fills in the regenerative expansion apparatus of this modified example.

In the first embodiment shown in FIG. 2, a part that the magnetic cold storage material of the second regenerative tube fills is formed by the magnetic shield member using the electric conductance. On the other hand, in a regenerative expansion apparatus 10a of this modified example, a magnetic shield member 27a using the electric conductance material comes in contact with and is provided so as to surround a part that the magnetic cold storage material 23 of a second regenerative tube 2a fills.

As shown in FIG. 3, a structure of the regenerative expansion apparatus 10a in this modified example is the same as that in the above-mentioned first embodiment except structures of a second regenerative tube 2a and a magnetic shield member 27a.

However, the second regenerative tube 2a is formed in a body from a high temperature end to a low temperature end. In order to make conductive loss in an axial direction minimum, a thin SUS material can be used for the second regenerative tube 2a. A material such as SUS 304 can be used as the SUS material. Inside the second regenerative tube 2a of this modified example as well as that of the first embodiment, the second cold storage material 22 and the magnetic cold storage material 23 fill from the high temperature end to the low temperature end. The magnetic cold storage material 23 includes, from the high temperature end to the low temperature end, the first magnetic cold storage material 24 and the second magnetic cold storage material 25.

In addition, the magnetic shield member 27a using the electric conductance material including an aluminum material or a copper material such as oxygen-free copper comes in contact with and is provided so as to surround a part that the magnetic cold storage material 23 of the second regenerative tube 2a fills. The magnetic shield member 27a is configured to shield the magnetic field change generated by the magnetic cold storage material 23.

An action of the regenerative expansion apparatus 10a for cryogenic cooling and an action of the magnetic cold storage material 23 for generating the magnetic field change in this modified example are the same as those of the above-discussed first embodiment. In addition, an action of the magnetic shield member 27a for shielding the magnetic field change in this modified example is the same as the magnetic shield member 27 in the first embodiment.

In other words, when the magnetic field change happens, the shield electric current flows into the magnetic shield member 27a so that the magnetic shield member 27a cancels, due to Lentz's law, the direction of the magnetic field generated by the magnetic field change, and thereby the magnetic field change is shielded.

In this modified example as well as the above-mentioned first embodiment, the magnetic field change can be shielded by selecting the electric conductance material having a small electric resistivity "ρ" and making the thickness "d" of the magnetic shield member 27a large. As the magnetic shield member 27a, the electric conductance material including, for example, an aluminum material or a copper material such as oxygen-free copper and having an electric resistivity equal to or less than 50 μΩcm at a normal temperature can be used. The thickness of the magnetic shield member 27a may be, for example, approximately 2.5 mm.

In the regenerative expansion apparatus 10a of this modified example, the second regenerative tube 2a is formed in a body from the first stage cold stage 5 to the second stage cold stage 6. Therefore, the regenerative expansion apparatus 10a has high mechanical strength. Unlike the regenerative expansion apparatus 10 of the first embodiment, in the regenerative expansion apparatus 10a, it is not necessary to connect the second regenerative tube member 26 and the magnetic shield member 27a, so that it is possible to achieve a simple structure having high mechanical strength.

Thus, according to the regenerative expansion apparatus of this modified example, the magnetic field change generated by the magnetic cold storage material is shielded by the magnetic shield member using the electric conductance material. Accordingly, in this example compared to a case where the magnetic field change is shielded by the superconducting magnetic shield member, there is no loss of cryogenic cooling due to cooling the superconducting magnetic shield member so that it is possible to prevent degradation of the cryogenic cooling capacity of the cryogenic cooler having the regenerative expansion apparatus.

Second Modified Example of the First Embodiment

Next, a regenerative expansion apparatus of a second modified example of the first embodiment of the present invention is discussed with reference to FIG. 4.

Figure 4:
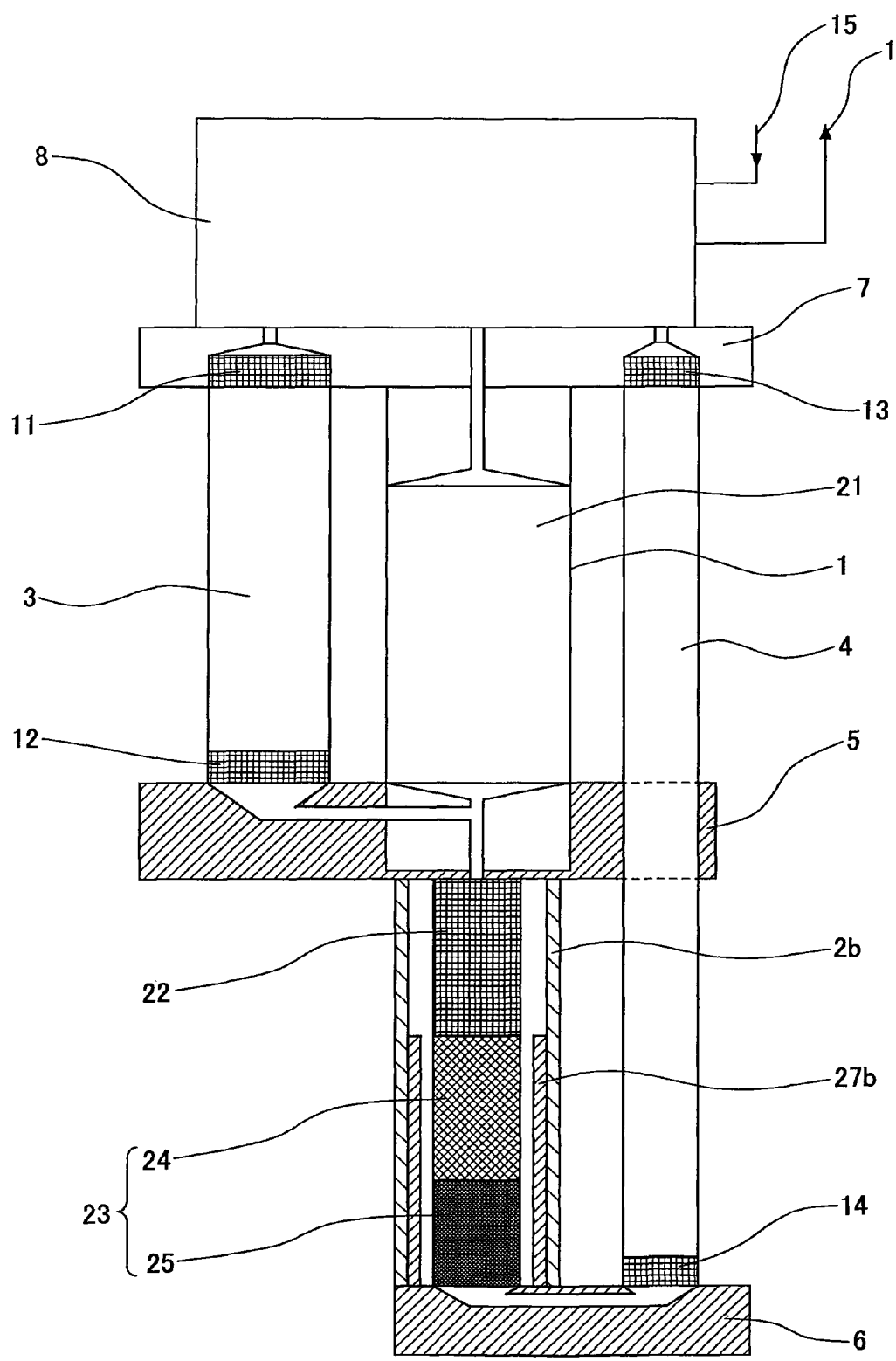
FIG. 4 is a schematic view of a structure of a regenerative expansion apparatus of a second modified example of the first embodiment of the present invention.

FIG. 4 is a schematic view of a structure of a regenerative expansion apparatus of a second modified example of the first embodiment of the present invention.

The regenerative expansion apparatus of this modified example is different from that of the first embodiment in that the magnetic shield member using the electric conductance material is provided on an internal circumferential surface of a part that the magnetic cold storage material of the second regenerative tube fills in the regenerative expansion apparatus of this modified example.

In the first embodiment shown in FIG. 2, a part that the magnetic cold storage material of the second regenerative tube fills is formed by the magnetic shield member using the electric conductance. On the other hand, in a regenerative expansion apparatus 10b of this modified example, a magnetic shield member 27b using the electric conductance material is provided on an internal circumferential surface of a part that the magnetic cold storage material 23 of the second regenerative tube 2b fills.

As shown in FIG. 4, a structure of the regenerative expansion apparatus 10b in this modified example is the same as that in the above-mentioned first embodiment except structures of a second regenerative tube 2b and a magnetic shield member 27b.

However, in the second modified example as well as the first modified example of the first embodiment, the second regenerative tube 2b is formed in a body from a high temperature end to a low temperature end. A thin SUS material can be used for the second regenerative tube 2b. A material such as SUS 304 can be used as the SUS material. The second cold storage material 22 and the magnetic cold storage material 23 made of the first magnetic cold storage material 24 and the second magnetic cold storage material 25 fill inside the second regenerative tube 2b of this modified example as well as that of the first modified example.

In addition, the magnetic shield member 27b using the electric conductance including an aluminum material or a copper material such as oxygen-free copper is provided on the internal circumferential surface of a part that the magnetic cold storage material 23 of the second regenerative tube 2b fills. As the magnetic shield member 27b, for example, a tube-shaped member such as copper tube or aluminum tube can be used. In addition, a film of, for example, copper, aluminum, or gold which is formed on the internal circumferential surface of the second regenerative tube 2b can be used as the magnetic shield member 27b.

An action of the regenerative expansion apparatus 10b for cryogenic cooling and an action of the magnetic cold storage material 23 for generating the magnetic field change in this modified example are the same as those of the above-discussed first embodiment. In addition, an action of the magnetic shield member 27b for shielding the magnetic field change in this modified example is the same as the magnetic shield member 27 in the first embodiment.

In other words, when the magnetic field change happens, the shield electric current flows into the magnetic shield member 27b so that the magnetic shield member 27b cancels, due to Lentz's law, the direction of the magnetic field generated by the magnetic field change, and thereby the magnetic field change is shielded.

In this modified example as well as the above-mentioned first embodiment, the magnetic field change can be shielded by selecting the electric conductance material having a small electric resistivity "ρ" and making the thickness "d" of the magnetic shield member 27b large. As the magnetic shield member 27b, the electric conductance material including, for example, an aluminum material or a copper material such as oxygen-free copper and having an electric resistivity equal to or less than 50 μΩcm at a normal temperature can be used. The thickness of the magnetic shield member 27b may be, for example, approximately 2.5 mm.

In the regenerative expansion apparatus 10b of this modified example, the second regenerative tube 2b is formed in a body from the first stage cold stage 5 to the second stage cold stage 6. Therefore, the regenerative expansion apparatus 10b has high mechanical strength. In the regenerative expansion apparatus 10b, as well as the regenerative expansion apparatus 10 of the first embodiment, it is not necessary to connect the second regenerative tube member 26 and the magnetic shield member 27a. Hence, it is possible to achieve a simple structure having high mechanical strength.

Thus, according to the regenerative expansion apparatus of this modified example, the magnetic field change generated by the magnetic cold storage material is shielded by the magnetic shield member using the electric conductance material. Accordingly, in this example compared to a case where the magnetic field change is shielded by the superconducting magnetic shield member, there is no loss of cryogenic cooling due to cooling the superconducting magnetic shield member so that it is possible to prevent degradation of the cryogenic cooling capacity of the cryogenic cooler having the regenerative expansion apparatus.

Second Embodiment

Figure 5:
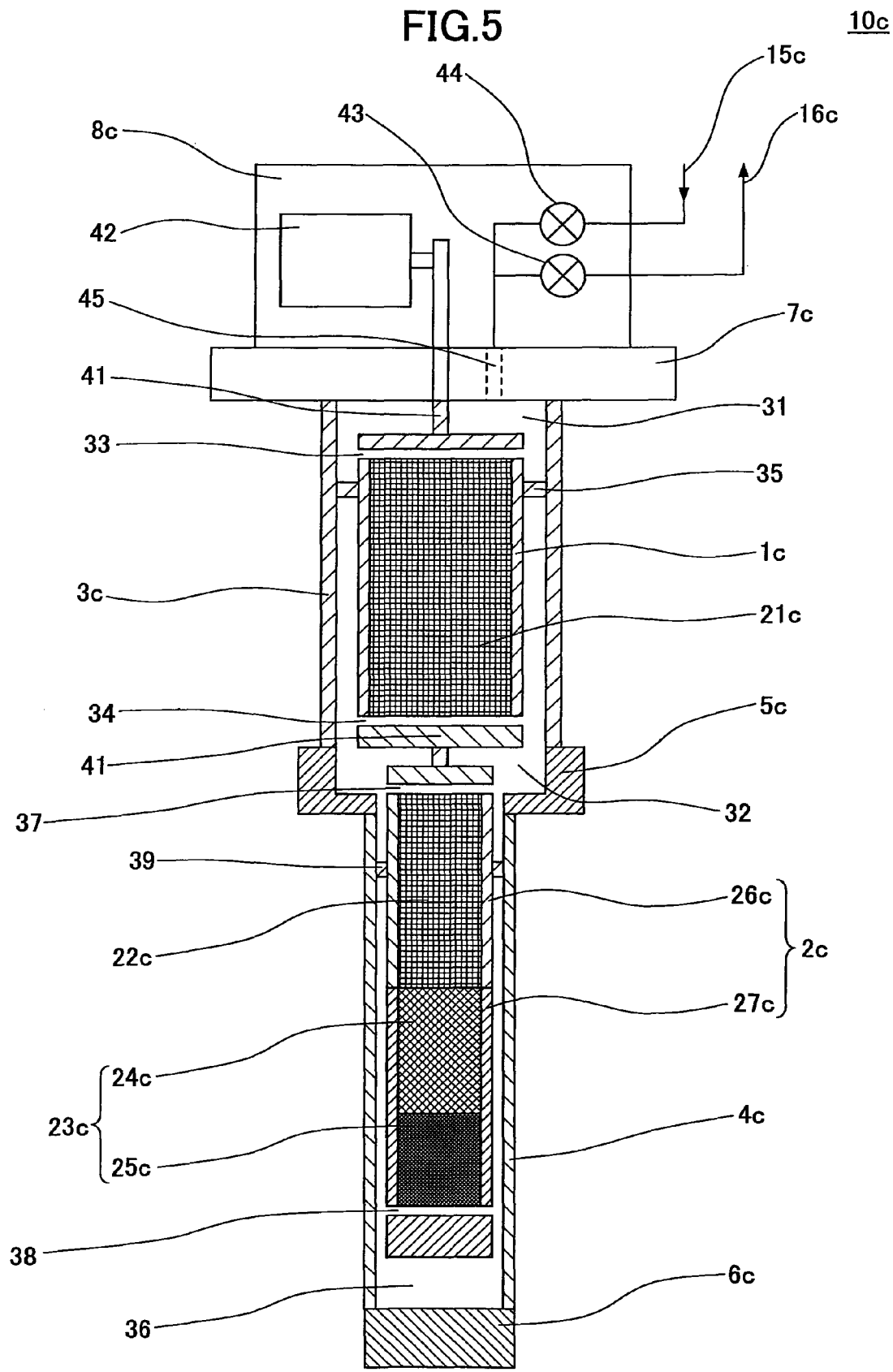
FIG. 5 is a schematic view of a structure of a regenerative expansion apparatus of a second embodiment of the present invention.

With reference to FIG. 5, a regenerative expansion apparatus of a second embodiment of the present invention is discussed.

Here, FIG. 5 is a schematic view of a structure of the regenerative expansion apparatus of the second embodiment of the present invention.

As shown in FIG. 5, a regenerative expansion apparatus 10c of this embodiment includes a first regenerative tube 1c, a second regenerative tube 2c, a first cylinder 3c, a second cylinder 4c, a first stage cold stage 5c, a second stage cold stage 6c, a flange 7c, and a valve/power house unit 8c.

Since the regenerative expansion apparatus 10c is a regenerative expansion apparatus for a Gifford McMahon (GM) cryogenic cooler, the first regenerative tube 1c and the second regenerative tube 2c function as a first displacer and a second displacer, respectively, of the GM cryogenic cooler.

In addition, from a high temperature end to a lower temperature end, the flange 7c, the first stage cold stage 5c, and the second stage cold stage 6c are provided with separation. Furthermore, the first regenerative tube 1c and the first cylinder 3c are provided so as to connect the flange 7c and the first stage cold stage 5c to each other. The second regenerative tube 2c and the second cylinder 4c are provided so as to connect the first stage cold stage 5c and the second stage cold stage 6c to each other.

The first cylinder 3c and the second cylinder 4c have cross sections having circular-shaped configurations. The first cylinder 3c and the second cylinder 4c are made of, for example, SUS, and have different internal diameters.

The first regenerative tube 1c is inserted into the first cylinder 3c so that the first stage cold stage 5c side (low temperature end) of the first regenerative tube 1c forms a first expansion space 32 between the first stage cold stage 5c side (low temperature end) of the first cylinder 3c and the first stage cold stage 5c side. The first regenerative tube 1c, for example, has a cylindrical container-shaped configuration and is made of phenol resin.

An opening part 33 is formed at the high temperature end of the first regenerative tube 1c so that the inside and the outside of the first regenerative tube 1c are in communication with each other. An opening part 34 is formed at the low temperature end of the first regenerative tube 1c so that the inside of the first regenerative tube 1c and the first expansion space 32 are in communication with each other.

The first cold storage material 21c fills the inside of the first regenerative tube 1c. As the first cold storage material 21c, for example, lead balls having a spherical-shaped configuration, a copper mesh, or the like can be used. A first seal member 35 is provided on external circumference of the first regenerative tube 1c. The first seal member 35 prevents communication between an upper side of the first seal member 35 and the first expansion space 32 via a gap between an external circumferential surface of the first regenerative tube 1c and an internal circumferential surface of the first cylinder 3c.

The second regenerative tube 2c is inserted into the second cylinder 4c so that the first stage cold stage 5c side (high temperature end) of the second regenerative tube 2c forms the first expansion space 32 between the first stage cold stage 5c side (high temperature end) of the second cylinder 4c and the first stage cold stage 5c; and the second stage cold stage 6c side (low temperature end) of the second regenerative tube 2c forms the second expansion space 36 between the second stage cold stage 6c side (low temperature end) of the second cylinder 4c and the second stage cold stage 6c. The second regenerative tube 2c, for example, has a cylindrical container-shaped configuration and is made of SUS or the like.

An opening part 37 is formed at the high temperature end of the second regenerative tube 2c so that the inside the second regenerative tube 2c and the first expansion space 32 are in communication with each other. An opening part 38 is formed at the low temperature end of the second regenerative tube 2c so that the inside of the second regenerative tube 2c and the second expansion space 36 are in communication with each other.

A second cold storage material 22c and the magnetic cold storage material 23c fill the inside of the second regenerative tube 2c in this order from the high temperature end to the low temperature end.

The magnetic cold storage material 23c includes a first magnetic cold storage material 24c and a second magnetic cold storage material 25c, in this order, from the high temperature end to the low temperature end. As the second cold storage material 22c, spherical-shaped lead balls having a diameter of approximately 0.2 mm can be used. As the first magnetic cold storage material 24c, spherical-shaped $Er_3Ni$ balls having a diameter of approximately 0.2 mm can be used. As the second magnetic cold storage material 25c, spherical-shaped $HoCu_2$ balls having a diameter of approximately 0.2 mm can be used.

A second seal member 39 is provided on the external circumference of the second regenerative tube 2c. The second seal member 36 prevents communication between the first expansion space 32 and the second expansion space 36 via a gap between an external circumferential surface of the second regenerative tube 2c and an internal circumferential surface of the second cylinder 4c.

The second regenerative tube 2c includes a second regenerative tube member 26c and a magnetic shield member 27c. The second regenerative tube member 26c is a part at a high temperature end of the second regenerative tube 2c that the second cold storage material 22c fills. The second regenerative tube 2c is made of a thin SUS material in order to make conductive loss in an axial direction minimum.

A cross section perpendicular to the axial direction of the second regenerative tube member 26c has, for example, an external diameter of approximately 40 mm, an internal diameter of approximately 35 mm, and a wall thickness of approximately 2.5 mm.

The magnetic shield member 27c is a part at a low temperature end of the second regenerative tube 2c that the first magnetic cold storage material 24c and the second magnetic cold storage material 25c fill. The magnetic shield member 27c is made of an electric conductor including, for example, aluminum material or a copper material such as oxygen-free copper. The magnetic shield member 27c that has an electric resistivity equal to or less than 50 μΩcm at a normal temperature can be used.

The magnetic shield member 27c is configured to shield the magnetic field change generated by the first magnetic cold storage material 24c and the second magnetic cold storage material 25c. A cross section perpendicular to the axial direction of the magnetic shield member 27c has, for example, an external diameter of approximately 40 mm, an internal diameter of approximately 35 mm, and a wall thickness of approximately 2.5 mm.

Next, an action of the regenerative expansion apparatus 10c for cryogenic cooling, an action of the magnetic cold storage material 23c for generating the magnetic field change, and an action of the magnetic shield member 27c for shielding the magnetic field change in this embodiment, are discussed.

First, the action of the regenerative expansion apparatus 10c for cryogenic cooling is discussed.

The first regenerative tube 1c and the second regenerative tube 2c are connected to each other by a connecting member 41. The first regenerative tube 1c is connected to a rotational axis of a motor 42 arranged in the valve/power house unit 8c via the connecting member 41. The connecting member 41 converts rotational movement of the motor 42. The connecting member 41 functions as a crank for reciprocally moving the second regenerative tube 2c in axial directions of the first cylinder 3c and the second cylinder 4c.

Two valves 43 and 44 are provided in the valve/power house unit 8c. Ends of the valves 44 and 43 are connected to a supply pipe 15c and a receiving pipe 16c, respectively. Other ends of the valves 43 and 44 are joined so as to be connected to the first expansion space 33 via the opening part 45.

When the regenerative expansion apparatus 10c is operated, the coolant gas is supplied at a designated timing from the supply pipe 15c into the first cylinder 3c. At a next designated timing, the coolant gas is received from the first cylinder 3c into the receiving pipe 16c. As the coolant gas, helium (He) gas having a pressure of, for example, approximately 0.5 MPa through approximately 2.5 Mpa is used.

The coolant gas supplied into the first cylinder 3c reaches the inside of the first regenerative tube 1c, the inside of the first expansion space 32, the inside of the second regenerative tube 2c, and the inside of the second expansion space 36. At this time, the opening parts 33, 34, 37, and 38 work as flow paths of the coolant gas.

The structure of the regenerative expansion apparatus 10c is formed such that the adiabatic expansion of the coolant gas is made accompanying the extension of the first expansion space 32 and the second expansion space 36. The supply of the coolant gas from the supply pipe 15c to the first cylinder 3c and receipt of the coolant gas from the first cylinder 3c into the receiving pipe 16c are performed under the reciprocal movement of the first regenerative tube 1c and the second regenerative tube 2c and designated phase difference. By the reciprocating movement of the first regenerative tube 1c and the second regenerative tube 2c in the axial directions of the first cylinder 3c and the second cylinder 4c repeatedly, adiabatic expansion of the coolant gas is repeated.

As a result of this, the first cold storage material 21c filling the first regenerative tube 1c, the second cold storage material 22c filling the second regenerative tube 2c, the first magnetic cold storage material 24c, and the second magnetic cold storage material 25c are gradually cooled so as to have a constant temperature. Furthermore, the first stage cold stage 5c and the second stage cold stage 6c are cooled so as to have a constant temperature. For example, the first stage cold stage 5c can be cooled at approximately 40 K and the second stage cold stage 6c can be cooled at approximately 4 K.

Next, the action of the magnetic cold storage material 23c for generating the magnetic field change is discussed.

The first regenerative tube 1c and the second regenerative tube 2c are reciprocally and repeatedly moved in the axial directions of the first cylinder 3c and the second cylinder 4c by the power of the motor 42 via the connecting member 41. A stroke of the reciprocal movement may be, for example, approximately 10 mm through approximately 30 mm. A repeating speed of the reciprocating movement can be, for example, approximately 1 Hz through approximately 2 HZ. Based on this, positions of the first magnetic cold storage material 24c and the second magnetic cold storage material 25c filling the second regenerative tube 2c are also reciprocally and periodically moved in the axial directions of the second cylinder 4c. By this reciprocating movement, the magnetic field change is generated in the periphery of the first magnetic cold storage material 24c and the second magnetic cold storage material 25c at a repeating speed of, for example, approximately 1 Hz through approximately 2 Hz.

In addition, when the reciprocating movement of 10 cm through 30 cm strokes is generated, temperatures of the first magnetic cold storage material 24c and the second magnetic cold storage material 25c are periodically changed. Since magnetic susceptibility of the magnetic cold storage material normally has temperature dependency, strengths of magnetizations of the first magnetic cold storage material 24c and the second magnetic cold storage material 25c are changed due to change of temperature based on the reciprocating movement. Accordingly, the magnetic field is changed at the repeating speed of, for example, approximately 1 Hz through approximately 2 Hz by even change of the temperature.

Next, the action of the magnetic shield member 27c for shielding the magnetic field change is discussed. This action of the second embodiment is the same as that in the first embodiment.

The magnetic shield member 27c is made of the electric conductance material including, for example, an aluminum material or a copper material such as oxygen-free copper and having an electric resistivity equal to or less than 50 $\mu\Omega$cm at a normal temperature.

The shield electric current flows in the circumferential direction of the magnetic shield member 27c so that the magnetic shield member 27c cancels the magnetic field change, due to Lentz's law, and thereby the magnetic field change is shielded. The magnetic field change can be shielded by selecting the electric conductance material having a small electric resistivity "$\rho$" and making the thickness "d" of the magnetic shield member 27c large.

It is possible to shield the magnetic field change based on the reciprocating movement by using the magnetic shield member 27c made of, for example, copper or aluminum, having the thickness of approximately 2.5 mm, and having the cylindrical shaped configuration.

Furthermore, in the regenerative expansion apparatus 10c compared to the regenerative expansion apparatus 10 of the first embodiment, while the repeating speed is substantially the same, the magnetic field change ($\Delta B_1/\Delta t$) is increased because the stroke distance is increased. Hence, generated magnetic field $B_2$ is also increased. Therefore, the regenerative expansion apparatus 10c compared to the regenerative expansion apparatus 10 of the first embodiment can have greater magnetic shield effect.

Thus, it is possible to shield the magnetic field change without using the superconducting magnetic shield. Therefore, it is possible to reduce the magnetic noise which is a problem in the case of application to a magnetic measuring device such as the MRI apparatus. In addition, it is possible to reduce the load of the cryogenic cooler due to thermal loss which is a problem in the case of the superconducting magnetic shield.

Thus, according to the regenerative expansion apparatus of this embodiment, the magnetic field change generated by the magnetic cold storage material is shielded by the magnetic shield member using the electric conductance material. Accordingly, in this example compared to a case where the magnetic field change is shielded by the superconducting magnetic shield member, there is no loss of cryogenic cooling due to cooling the superconducting magnetic shield member so that it is possible to prevent degradation of the cryogenic cooling capacity of the cryogenic cooler having the regenerative expansion apparatus.

Third Embodiment

Figure 6:
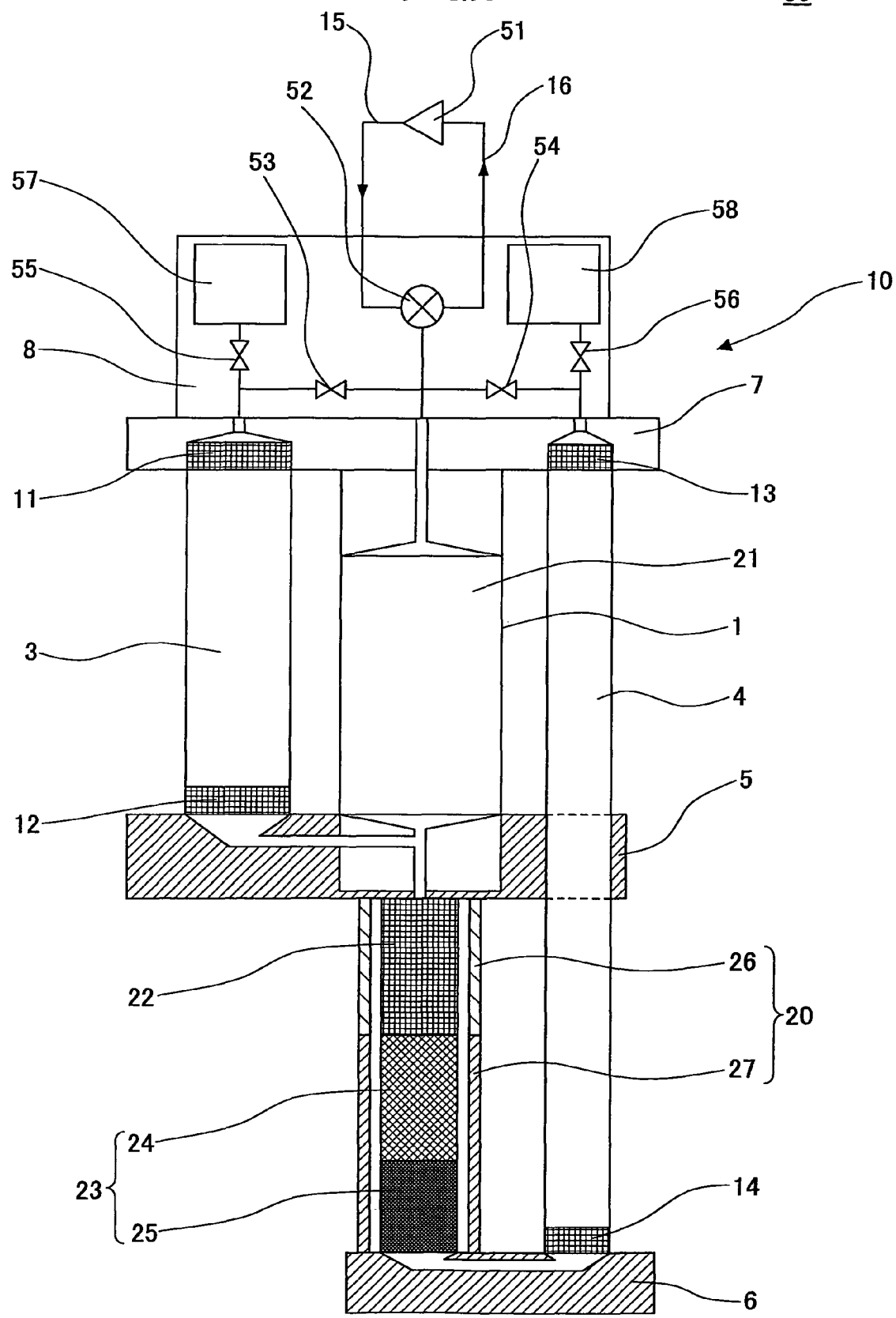
FIG. 6 is a schematic view of a structure of a pulse tube cryogenic cooler of a third embodiment of the present invention.

With reference to FIG. 6, a pulse tube cryogenic cooler of a third embodiment of the present invention is discussed.

Here, FIG. 6 is a schematic view of a structure of the pulse tube cryogenic cooler of the third embodiment of the present invention.

As shown in FIG. 6, a pulse tube cryogenic cooler 50 of the third embodiment of the present invention includes the regenerative expansion apparatus 10 of the first embodiment of the present invention and a compressor 51. In other words, the pulse tube cryogenic cooler 50 of the third embodiment of the present invention has a two-stage structure.

The structures of the first regenerative tube 1, the second regenerative tube 2, the first pulse tube 3, the second pulse tube 4, the first stage cold stage 5, the second stage cold stage 6, and the flange 7 of the pulse tube cryogenic cooler 50 are the same as those of the pulse tube cryogenic cooler 10 of the first embodiment of the present invention.

The valve/orifice/buffer unit 8 of the pulse tube cryogenic cooler 50, as well as that of the pulse tube cryogenic cooler 10, includes the supply pipe 15 and the receiving pipe 16. The valve/orifice/buffer unit 8 also includes a switching valve 52, orifices 53, 54, 55, and 56, and buffers 57 and 58.

The high temperature end of the first regenerative tube 1 is connected to the supply pipe 15 and the receiving pipe 16 via the switching valve 52. A motor is provided at the switching valve 52 so as to drive and rotate the switching valve 52. Accordingly, by driving and rotating the switching valve 52, the high temperature end of the first regenerative tube 1 is switched to and communicates with the supply pipe 15 or the receiving pipe 16.

The high temperature end of the first pulse tube 3 is connected to the high temperature end of the first regenerative tube 1 via the orifice 53. Similarly, the high temperature end of the second pulse tube 4 is connected to the high temperature end side of the first regenerative tube 1 via the orifice 54. In addition, the high temperature end of the first pulse tube 3 is in communication with the buffer 57 via the orifice 55. Similarly, the high temperature end of the second pulse tube 4 is in communication with the buffer 58 via the orifice 56.

Next, an action of the pulse tube cryogenic cooler 50 is discussed.

By switching the switching valve 52 so that the high temperature end of the first regenerative tube 1 is switched to and in communication with the supply pipe 15, the coolant gas is supplied from the low temperature end of the first pulse tube 3 to the first pulse tube 3 via the low temperature end of the first regenerative tube 1. Compression and expansion of the coolant gas are repeated in the first pulse tube 3 so that cryogenic cooling is generated by the adiabatic expansion at that time.

In addition, in the pulse tube cryogenic cooler 50 of this embodiment, the coolant gas flows to the high temperature end of the first pulse tube 3 via the orifice 53 so that the flow of the coolant gas from the low temperature end of the first pulse tube 3 is prevented. As a result of this, the timing of movement of the coolant gas in the first pulse tube 3 is delayed relative to the timing of change of the pressure.

After that, when the pressure in the first pulse tube 3 becomes higher than the pressure in the buffer 57, the coolant gas of the high temperature end of the first pulse tube 3 flows into the buffer 57 via the orifice 55 and the coolant gas in the first pulse tube 3 moves to the high temperature end of the first pulse tube 3.

Similarly, the coolant gas led into the first regenerative tube 1 by switching the switching valve 52 is led from the low temperature end of the first regenerative tube 1 to the high temperature end of the second regenerative tube 2. While heat is transferred in the second regenerative tube 2, the coolant gas is supplied from the low temperature end of the second pulse tube 4 to the second pulse tube 4 via the low temperature end of the second regenerative tube 2. As a result of this, the coolant gas already existing in the second pulse tube 4 is pushed by newly flowing coolant gas so as to start moving to the high temperature end of the second pulse tube 4.

Simultaneously, the coolant gas flows into the high temperature end of the second pulse tube 4 via the orifice 54 so that the flow of the coolant gas from the low temperature end of the second pulse tube 4 is prevented. As a result of this, the timing of movement of the coolant gas in the second pulse tube 4 is delayed relative to the timing of change of the pressure.

After that, when the pressure in the second pulse tube 4 becomes higher than the pressure in the buffer 58, the coolant gas of the high temperature end of the second pulse tube 4 flows into the buffer 58 via the orifice 56 and the coolant gas in the second pulse tube 4 moves to the high temperature end of the second pulse tube 4.

Next, by switching and communicating the first regenerative tube 1 to and with the receiving pipe 16, accompanying the pressure decreasing in the first regenerative tube 1, the coolant gas in the second regenerative tube 2 starts to be attracted to the first regenerative tube 1. As a result of this, the coolant gas already existing in the second pulse tube 4 is attracted to the second regenerative tube 2 and the coolant gas in the second pulse tube 4 starts moving to the low temperature end of the second pulse tube 4.

Simultaneously, the coolant gas in the high temperature end of the second pulse tube 4 flows out via the orifice 54 so that the coolant gas flowing out from the low temperature end of the second pulse tube 4 is prevented.

After that, the coolant gas in the buffer 58 returns into the second pulse tube 4 via the orifice 56. The coolant gas in the second pulse tube 4 flows in the low temperature end of the second regenerative tube 2, moves to the high temperature end of the second regenerative tube 2 while the coolant gas cools the second cold storage material 22 and the magnetic cold storage material 23 so that coolant gas temperature increases, and returns to the receiving pipe 16 via the first regenerative tube 1.

Thus, compression and expansion of the coolant gas cooled at approximately 40 K by the first pulse tube 3 is repeated in the second pulse tube 4. By cryogenic cooling generated by adiabatic expansion at that time, the second stage cold stage 6 provided at the low temperature end of the second pulse tube 3 is cooled at approximately 4 K. As the coolant gas, helium (He) gas having a pressure of, for example, approximately 0.5 MPa through approximately 2.5 MPa is used.

In this embodiment, the magnetic shield member 27 is made of the electric conductance material including, for example, an aluminum material or a copper material such as oxygen-free copper and having an electric resistivity equal to or less than 50 μΩcm at a normal temperature. Therefore, the shield electric current flows in the circumferential direction of the magnetic shield member 27c so that the magnetic shield member 27 cancels the magnetic field change, due to Lentz's law, and thereby the magnetic field change is shielded.

Thus, according to the pulse tube cryogenic cooler, it is possible to shield the magnetic field change without using the superconducting magnetic shield. Therefore, it is possible to reduce the magnetic noise which is a problem in the case of application to a magnetic measuring device such as the MRI apparatus. In addition, it is possible to reduce the load of the cryogenic cooler due to thermal loss which is a problem in the case of the superconducting magnetic shield.

In the meantime, the pulse tube cryogenic cooler having the regenerative cryogenic cooler of the first embodiment and where the pulse tube is used as the cylinder is discussed in the third embodiment. However, the present invention is not limited to the pulse tube cryogenic cooler as long as the cryogenic cooler includes the regenerative cryogenic cooler discussed in the first embodiment and the modified examples of the first embodiment.

First Modified Example of the Third Embodiment

Next, a pulse tube cryogenic cooler of a first modified example of the third embodiment of the present invention is discussed with reference to FIG. 7.

Figure 7:
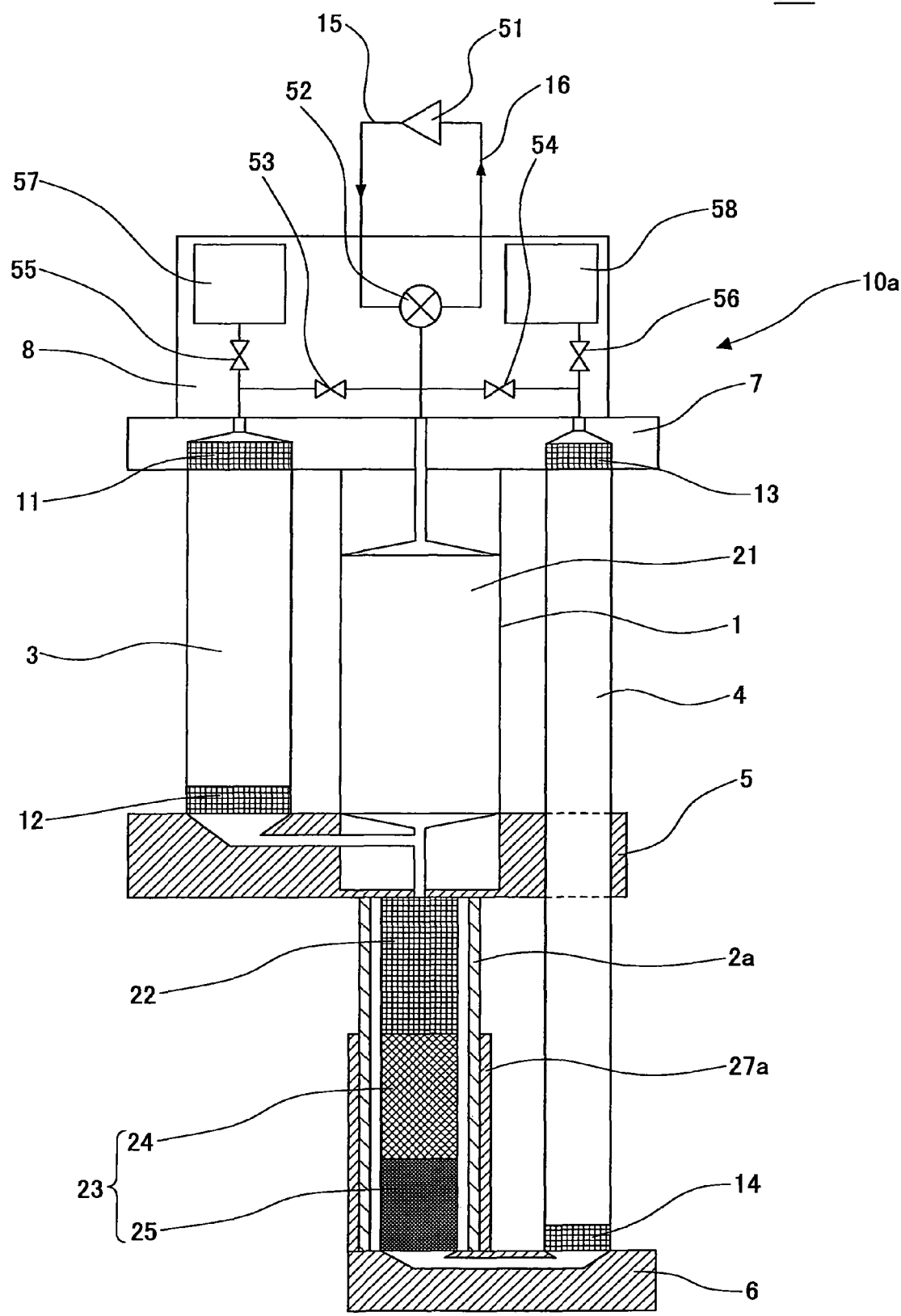
FIG. 7 is a schematic view of a structure of a pulse tube cryogenic cooler of a modified example of the third embodiment of the present invention.

FIG. 7 is a schematic view of a structure of the pulse tube cryogenic cooler of the modified example of the third embodiment of the present invention.

The pulse tube cryogenic cooler of this modified example is different from that of the third embodiment in that the magnetic shield member using the electric conductance material comes in contact with and is provided so as to surround a part that the magnetic cold storage material of the second regenerative tube fills in the pulse tube cryogenic cooler of this modified example.

In the third embodiment shown in FIG. 6, a part that the magnetic cold storage material of the second regenerative tube fills is formed by the magnetic shield member using the electric conductance. On the other hand, in a pulse tube cryogenic cooler 50a of this modified example, a magnetic shield member 27a using the electric conductance material comes in contact with and is provided so as to surround a part that the magnetic cold storage material 23 of a second regenerative tube 2a fills. In other words, in this modified example, the regenerative expansion apparatus 10a of the first modified example of the first embodiment, instead of the regenerative expansion apparatus 10 of the first embodiment, is used in the third embodiment.

As shown in FIG. 7, a structure of the pulse tube cryogenic cooler 50a in this modified example is the same as that in the above-mentioned third embodiment except structures of a second regenerative tube 2a and a magnetic shield member 27a.

The second regenerative tube 2a is formed in a body from a high temperature end to a low temperature end. In addition, the magnetic shield member 27a using the electric conductance material having an electric resistivity equal to or less than 50 μΩcm at a normal temperature and including an aluminum material or a copper material such as oxygen-free copper comes in contact with and is provided so as to surround a part that the magnetic cold storage material 23 of the second regenerative tube 2a fills.

Actions of the pulse tube cryogenic cooler 50a and the magnetic shield member 27a in this modified example are the same as those of the third embodiment. A structure of the pulse tube cryogenic cooler 50a, compared to the pulse tube cryogenic cooler 50 of the third embodiment, is simple and has high mechanical strength.

Thus, according to the pulse tube cryogenic cooler of this modified example, it is possible to shield the magnetic field change without using the superconducting magnetic shield. Therefore, it is possible to reduce the magnetic noise which is a problem in the case of application to a magnetic measuring device such as the MRI apparatus. In addition, it is possible to reduce the load of the cryogenic cooler due to thermal loss which is a problem in the case of the superconducting magnetic shield.

In this modified example, as discussed above, the magnetic shield member comes in contact with and is provided so as to surround a part that the magnetic cold storage material of the second regenerative tube fills. However, the magnetic shield member may be provided on an internal circumference of a part that the magnetic cold storage material of the second regenerative tube fills.

Fourth Embodiment

With reference to FIG. 7, a magnetic resonance imaging apparatus of a fourth embodiment of the present invention is discussed.

The magnetic resonance imaging apparatus is called an MRI (Magnetic Resonance Imaging) apparatus. In the magnetic resonance imaging apparatus, an NMR (Nuclear Magnetic Resonance) signal obtained by an NMR phenomenon is processed so that information of the inside of an organism can be imaged. In the NMR phenomenon, an atomic nucleus in a substance arranged in a static magnetic field interacts with an electromagnetic wave having a characteristic frequency.

Figure 8:
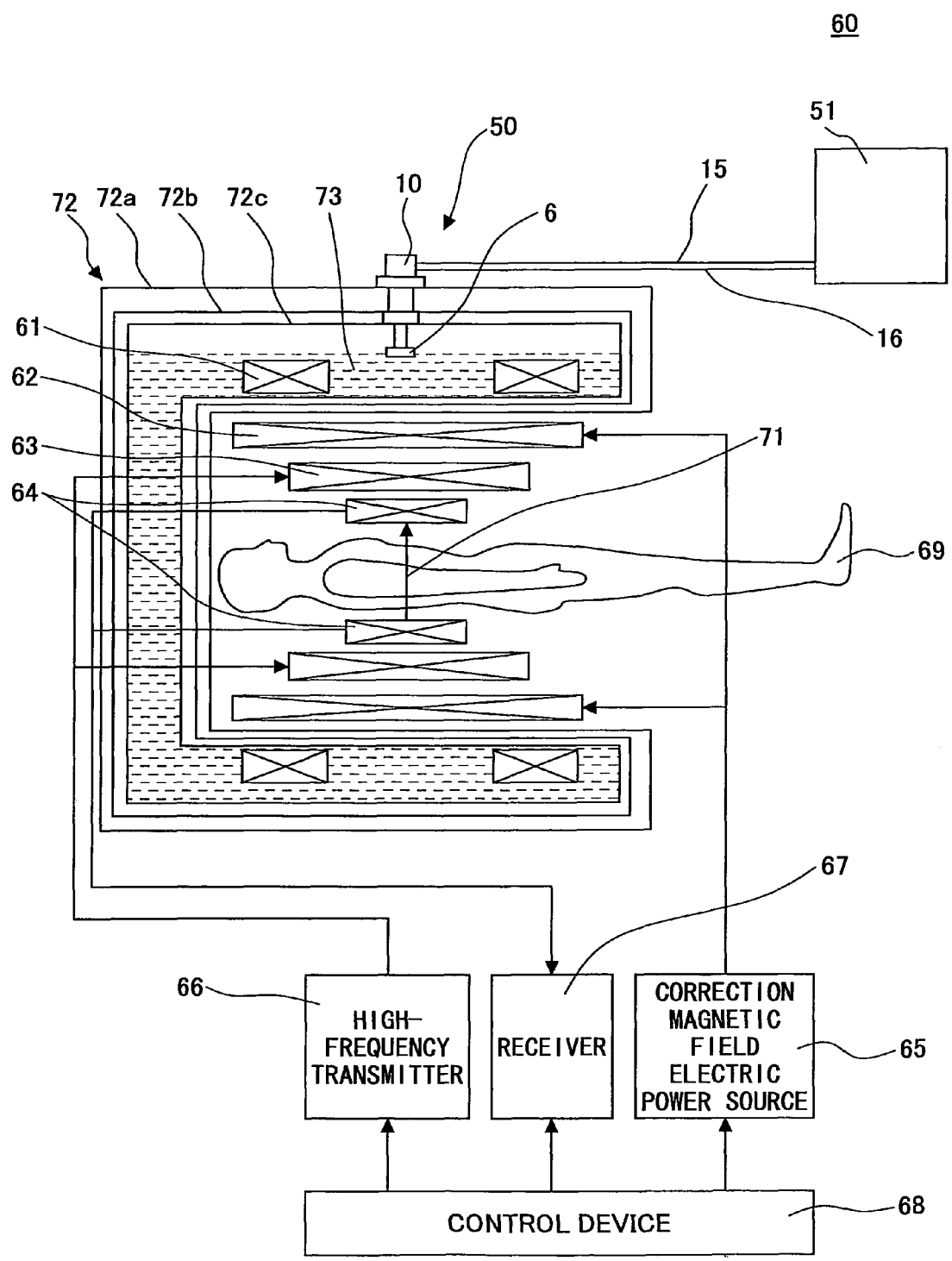
FIG. 8 is a schematic view of a structure of a magnetic resonance imaging apparatus of a fourth embodiment of the present invention.

FIG. 8 is a schematic view of a structure of the magnetic resonance imaging apparatus of the fourth embodiment of the present invention.

As shown in the FIG. 8, a magnetic resonance imaging apparatus 60 of this embodiment includes a superconducting magnet 61, a correction magnetic field coil 62, a high frequency coil 63, a detection coil 64, a correction magnetic field electric power source 65, a high frequency transmitter 66, a receiver 67, and a control device 68.

The superconducting magnet 61 is arranged to sandwich a space where a specimen 69 is arranged. The detection coil 64 is provided inside the high frequency coil 63 so as to be close to the specimen 69.

The superconducting magnet 61 generates a uniform magnetic field 71 surrounding the specimen 69. The direction of the magnetic field 71 goes from the floor to the ceiling as indicated by an arrow in FIG. 8. A magnetic field uniformity coefficient of the magnetic field 71 is adjusted so as to be, for example, equal to or less than approximately 5 ppm in the space where the specimen 69 is arranged. The magnetic field uniformity coefficient is adjusted by flowing an electric current through the correction magnetic field coil 62 by using the correction magnetic field electric power source 65.

The high frequency coil 63 is connected to the control device 68 via the high frequency transmitter 66. The detection coil 64 is connected to the control device 68 via the receiver 67. Following the control signal from the control device 68, the high frequency coil 63 generates the high frequency magnetic field for exciting nuclear magnetic resonance at a detected part of the specimen 69 and applies the high frequency magnetic field to the specimen 69.

By this high frequency magnetic field, the nuclear magnetic resonance is excited at the specimen 69. The NMR signal obtained by the nuclear magnetic resonance is detected by the detection coil 64 so as to be transmitted to the control device 68 via the receiver 67 and thereby a calculating process such as image reconstructing or spectral calculation is performed.

The superconducting magnet 61 is received in a low temperature vessel 72. The low temperature vessel 72 has a multilayer structure formed by, in this order from outside to inside, a vacuum vessel 72a, a radiation shield 72b, a liquid helium vessel 72c, and others.

Liquid helium 73 having a temperature of approximately 4.2 K fills the inside of the liquid helium vessel 72c so that a superconducting state of the superconducting magnet 61 is maintained. The superconducting magnet 61 is arranged so as to be dipped in the liquid helium 73. In addition, the pulse tube cryogenic cooler 50 of the third embodiment of the present invention is provided in the liquid helium vessel 72c so that the amount of evaporation of the liquid helium 73 is reduced.

The pulse tube cryogenic cooler 50 includes the regenerative expansion apparatus 10, the compressor 51, the supply pipe 15, and the receiving pipe 16. The pulse tube cryogenic cooler 50 is a two-stage type pulse tube cryogenic cooler and the second stage cold stage 6 comes in thermal contact with the liquid helium 73.

Helium gas compressed by the compressor 51 is supplied to the pulse tube cryogenic cooler 50 via the supply pipe 15. After the adiabatic expansion of the helium gas, the helium gas returns to the compressor 51 again via the receiving pipe 16. The action is repeated at a frequency of, for example, approximately 2 Hz. As a result of this, the liquid helium 73 and the second stage cooling stage 6 of the pulse tube cryogenic cooler 50 are cooled at approximately 4.2 K.

The pressure in the pulse tube cryogenic cooler 50 is changed with the frequency of, for example, approximately 2 Hz, by periodically supplying and receiving of the helium gas from and at the compressor 51. The magnetic cold storage material filling the second regenerative tube is vibrated at the frequency of, for example, approximately 2 Hz so that the magnetic field 71 applied to the specimen 69 is changed at the frequency of, for example, approximately 2 Hz. Accordingly, it is necessary to provide a magnetic shield part configured to shield the magnetic field change generated by the vibration of the magnetic cold storage material.

In a case where the magnetic shield member uses the correction magnetic field coil 62, the operational signal is taken to the compressor 51 and the control signal is transmitted from the control device 68 so that the correction magnetic field electric power source 65 is driven. A magnetic field having a size the same as the magnetic field change and having an opposite phase is generated at the correction magnetic field coil 62. Therefore, the electric power load becomes large.

In a case where the magnetic shield member uses the superconducting magnetic shield member, the temperature is increased by heat exchange of the superconductor and the second regenerative tube that the magnetic cold storage material fills, so that the temperature of the second stage cold stage 6 is increased. Hence, a cryogenic cooling capacity of the pulse tube cryogenic cooler 50 is degraded.

However, in this embodiment, a part that the magnetic cold storage material of the second regenerative tube fills is formed by the magnetic shield member using the electric conductance material having an electric resistivity equal to or less than 50 μΩcm at a normal temperature and including an aluminum material or a copper material such as oxygen-free copper. Because of this, the magnetic field change generated from vibration of the magnetic cold storage material is canceled by the magnetic shield member.

Accordingly, there is no need to provide a new part for shielding the magnetic field change generated from vibration of the magnetic cold storage material. It is not necessary to newly operate the correction magnetic field electric power source 65 so that degradation of the cryogenic cooling capacity due to cooling the superconducting magnetic shield member does not happen.

Thus, according to the magnetic resonance imaging apparatus of this embodiment, it is possible to shield the magnetic field change without using the correction magnetic field electric power source and the superconducting magnetic shield. Therefore, it is possible to reduce the magnetic noise which is a problem in the case of application to a magnetic measuring device such as the MRI apparatus. In addition, it is possible to reduce the load of the cryogenic cooler due to thermal loss which is a problem in the case of the superconducting magnetic shield.

In this embodiment, a structure of a magnetic resonance imaging apparatus using the pulse tube cryogenic cooler of the third embodiment is discussed. However, as the cryogenic cooler provided in the magnetic resonance imaging apparatus, a cryogenic cooler having the regenerative expansion apparatuses for the pulse tube cryogenic cooler of the first and second modified examples of the first embodiment or the regenerative expansion apparatus for the GM cryogenic cooler of the second embodiment can be used.

Fifth Embodiment

Next, a nuclear magnetic resonance apparatus of a fifth embodiment of the present invention is discussed with reference to FIG. 9.

The nuclear magnetic resonance apparatus is called an NMR (Nuclear Magnetic Resonance) apparatus. In the nuclear magnetic resonance apparatus, when an atomic nucleus in a substance arranged in a static magnetic field and an electromagnetic wave having a characteristic frequency interact, a nuclear magnetic resonance phenomenon is used where the characteristic frequency is slightly changed due to the atmosphere near an atom in the molecule so that the substance is analyzed.

Figure 9:
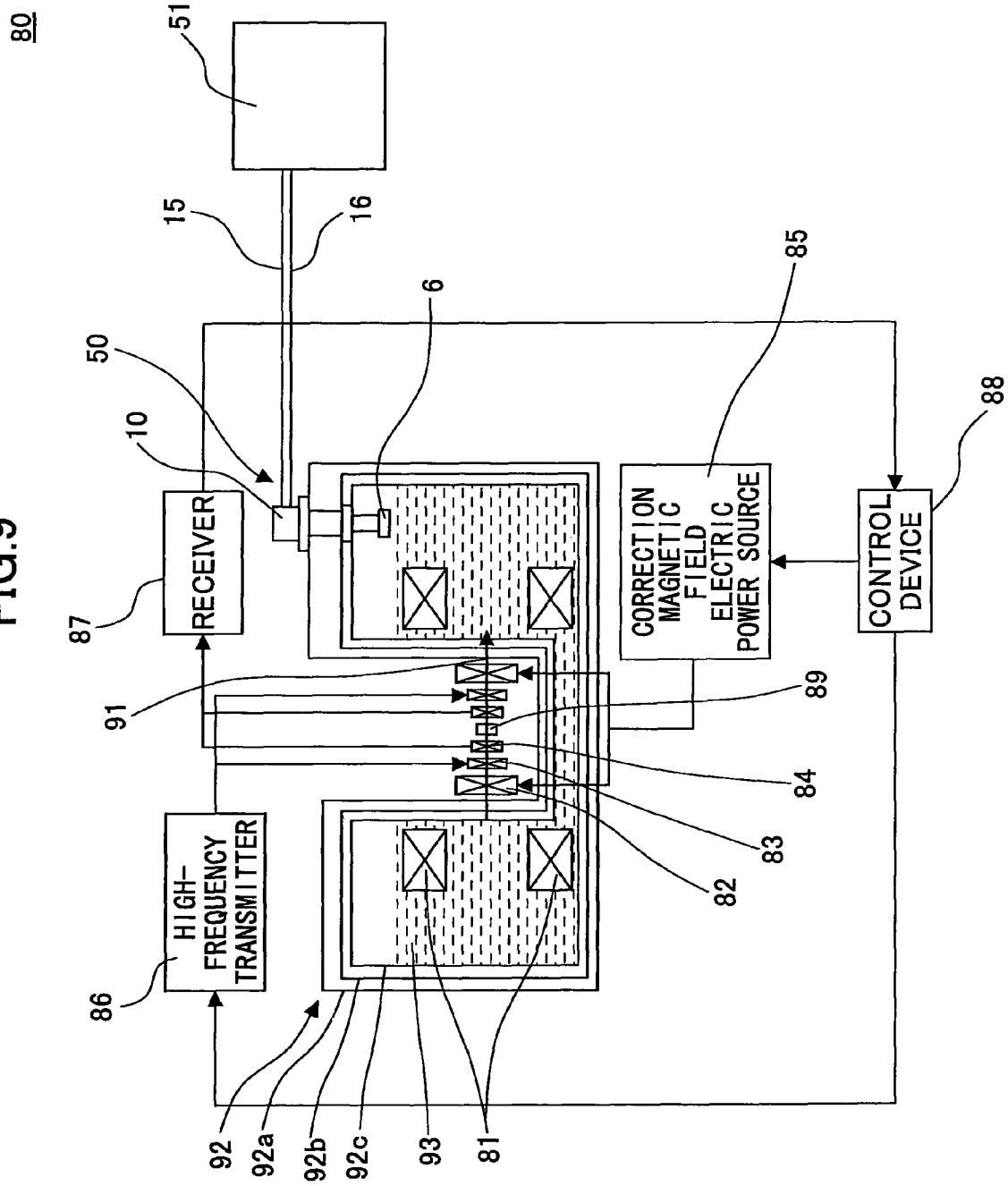
FIG. 9 is a schematic view of a structure of a nuclear magnetic resonance apparatus of a fifth embodiment of the present invention.

FIG. 9 is a schematic view of a structure of the nuclear magnetic resonance apparatus of the fifth embodiment of the present invention.

As shown in the FIG. 9, a nuclear magnetic resonance apparatus 80 of this embodiment includes a superconducting magnet 81, a correction magnetic field coil 82, a high frequency coil 83, a detection coil 84, a correction magnetic field electric power source 85, a high frequency transmitter 86, a receiver 87, and a control device 88.

The superconducting magnet 81 is arranged to sandwich a space where a specimen 89 is arranged. The correction magnetic field coil 82 is arranged inside the superconducting magnet 81. The high frequency coil 83 is arranged inside the correction magnetic field coil 82. The detection coil 84 is provided inside the high frequency coil 83 so as to close to the specimen 89.

The superconducting magnet 81 is arranged so that the magnetic field is generated in a horizontal direction. The superconducting magnet 81 is inserted from the upper part of the apparatus. The superconducting magnet 81 applies, in a horizontal direction, the magnetic field 91 to a measured test material specimen 89 provided in a vertical direction. The magnetic field uniformity coefficient of the magnetic field 91 is improved by the correction magnetic field coil 82.

The high frequency coil 83 is connected to the control device 88 via the high frequency transmitter 86. The detection coil 84 is connected to the control device 88 via the receiver 87. Following the control signal from the control device 88, the high frequency coil 83 generates the high frequency magnetic field for exciting nuclear magnetic resonance at the measured test material 89 and applies the high frequency magnetic field to the measured test material 89.

By this high frequency magnetic field, the nuclear magnetic resonance is excited at the measured test material 89. The NMR signal obtained by the nuclear magnetic resonance is detected by the detection coil 84 so as to be transmitted to the control device 88 via the receiver 87 and thereby a calculating process is performed.

The superconducting magnet 81 is received in a low temperature vessel 82. The low temperature vessel 82 has a multilayer structure formed by, in this order from outside to inside, a vacuum vessel 92a, a radiation shield 92b, a liquid helium vessel 92c, and others. Liquid helium 93 having a temperature of approximately 4.2 K fills the inside of the liquid helium vessel 92c so that a superconducting state of the superconducting magnet 81 is maintained. The superconducting magnet 81 is arranged so as to be dipped in the liquid helium 93. In addition, the pulse tube cryogenic cooler 50 of the third embodiment of the present invention is provided in the liquid helium vessel 92c so that the amount of evaporation of the liquid helium 93 is reduced.

The pulse tube cryogenic cooler 50 of this embodiment, as well as the third embodiment, includes the regenerative expansion apparatus 10, the compressor 51, the supply pipe 15, and the receiving pipe 16. In this embodiment, as well as the third embodiment, vibration is generated by periodically supplying and receiving of the helium gas from and at the compressor 51 in the pulse tube cryogenic cooler 50 so that the magnetic field change is generated by the vibration of the magnetic cold storage material filling the regenerative tube.

In this embodiment, a part that the magnetic cold storage material of the regenerative tube fills is formed by the magnetic shield member using the electric conductance material having an electric resistivity equal to or less than 50 μΩcm at a normal temperature and including an aluminum material or a copper material such as oxygen-free copper. Because of this, the magnetic field change generated by vibration of the magnetic cold storage material is canceled by the magnetic shield member.

Accordingly, there is no need to provide a new part for shielding the magnetic field change generated by vibration of the magnetic cold storage material. It is not necessary to newly operate the correction magnetic field electric power source 85 so that degradation of the cryogenic cooling capacity due to cooling the superconducting magnetic shield member does not happen.

Thus, according to the nuclear magnetic resonance apparatus of this embodiment, it is possible to shield the magnetic field change without using the correction magnetic field electric power source and the superconducting magnetic shield. Therefore, it is possible to reduce the magnetic field change which is a problem in the case of measurement of the NMR apparatus. In addition, it is possible to prevent the increase of the electric power source load at the time of application of the correction magnetic field or the degradation of a cryogenic cooling capacity of the cryogenic cooler which is a problem in a case where the superconducting magnetic shield member is provided.

In this embodiment, a structure of a nuclear magnetic resonance apparatus using the pulse tube cryogenic cooler of the third embodiment is discussed. However, as the cryogenic cooler provided in the nuclear magnetic resonance apparatus, a cryogenic cooler having the regenerative expansion apparatuses for the pulse tube cryogenic cooler of the first and second modified examples of the first embodiment or the regenerative expansion apparatus for the GM cryogenic cooler of the second embodiment can be used.

Sixth Embodiment

Next, a superconducting quantum interference device flux meter of the sixth embodiment of the present invention is discussed with reference to FIG. 10.

The superconducting quantum interference device (SQUID) is a supersensitive magnetic sensor using a quantification phenomenon of superconductivity. When a magnetic field going through the superconducting ring having a Josephson junction is changed, a voltage is changed at the Josephson junction part. By measuring change of the voltage, it is possible to measure minute magnetic field changes.

In addition, the superconducting quantum interference device flux meter uses the SQUID as the supersensitive magnetic sensor. For example, the superconducting quantum interference device flux meter is used for measuring minute magnetic fields generated by a part of an organism such as a cerebral nerve.

Figure 10:
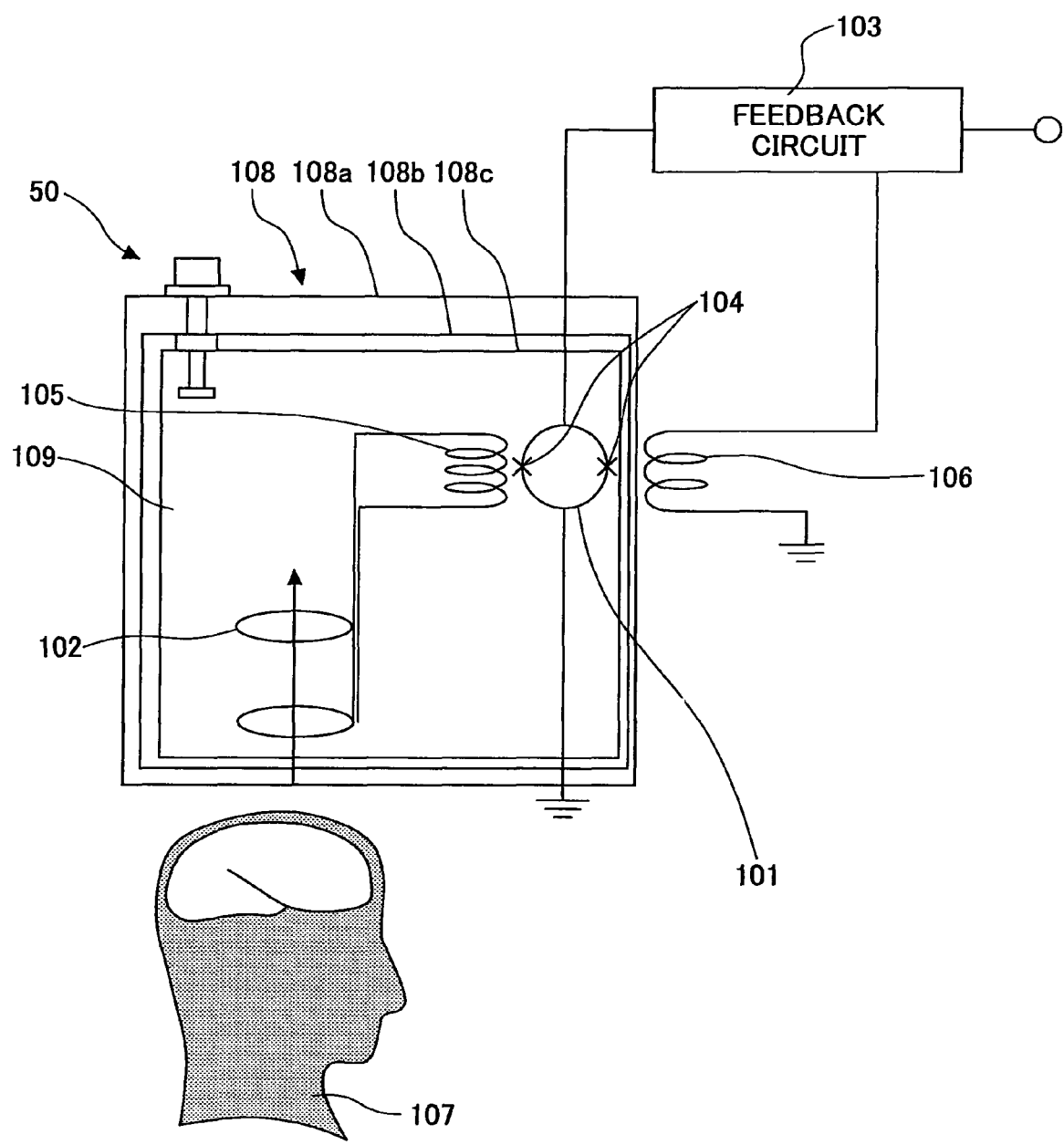
FIG. 10 is a schematic view of a structure of a superconducting quantum interference device flux meter of a sixth embodiment of the present invention.

FIG. 10 is a schematic view of a structure of the superconducting quantum interference device flux meter of the sixth embodiment of the present invention.

As shown in FIG. 10, a superconducting quantum interference device flux meter 100 of this embodiment includes a superconducting quantum interference device 101, a detection coil 102, and a feedback circuit 103 including an electric power source.

The superconducting quantum interference device 101 includes a superconducting ring having two Josephson junctions 104. The Josephson junction 104 is a joint part having weak superconductivity where the size of a superconducting electric current flowing beyond a boundary of two superconducting parts, the boundary being a grain boundary or a normal conductive film, is limited. An input coil 105 and a feedback coil 106 are provided so as to be close to the superconducting quantum interference device 101 and be magnetically connected to each other.

The detection coil 102 is configured to detect minute magnetic field changes generated by the specimen 107 and is made of a superconducting wire. Both ends of the detection coil 102 are connected to both ends of the input coil 105 magnetically connected to the superconducting quantum interference device 101. As a result of this, the detection coil 102 and the input coil 105 form a single superconducting closed loop.

The feedback circuit 103 is connected to the feedback coil 102 and the superconducting quantum interference device 101. The feedback circuit 103 performs negative feedback of a non-linear magnetic flux—voltage curve obtained from an output voltage of the superconducting quantum interference device 101, via the feedback coil 106, by the superconducting quantum interference device 101, so as to covert it to a linear magnetic flux—voltage curve and output the curve.

Here, if the magnetic field change is generated by the specimen, the amount of a magnetic flux linked with the detection coil 102 is changed. A signal of the amount of change of the magnetic flux is transmitted to the superconducting quantum interference device 101 by a negative effect (perfect diamagnetism) of the superconducting closed loop. The signal is output as a voltage, via the feedback coil 106 and the feedback circuit 103.

In this embodiment, the superconducting quantum interference device 101 and the feedback coil 106 are cooled by the helium gas 109 cooled at cryogenic temperature or the liquid helium in the low temperature vessel 108 so as to be kept at low temperature so that the superconducting state can be maintained. The low temperature vessel 108 has a multi-layer structure formed by, in this order from outside to inside, a vacuum vessel 108a, a radiation shield 108b, a helium vessel 108c, and others. Furthermore, in this embodiment as well as the fourth embodiment, the pulse tube cryogenic cooler 50 is provided in the low temperature vessel 108 so that the helium gas cooled at the cryogenic temperature or the liquid helium is cooled.

In this embodiment, a part that the magnetic cold storage material of the second regenerative tube fills is formed by the magnetic shield member using the electric conductance material having an electric resistivity equal to or less than 50 μΩcm at a normal temperature and including an aluminum material or a copper material such as oxygen-free copper. Because of this, the magnetic field change generated by vibration of the magnetic cold storage material is canceled by the magnetic shield member.

Accordingly, there is no need to provide a new part for shielding the magnetic field change generated by vibration of the magnetic cold storage material. It is not necessary to newly operate the correction magnetic field electric power source so that degradation of the cryogenic cooling capacity due to cooling the superconducting magnetic shield member does not happen.

Thus, according to the superconducting quantum interference device flux meter of this embodiment, it is possible to shield the magnetic field change without using the correction magnetic field electric power source and the superconducting magnetic shield member. Therefore, it is possible to reduce the magnetic field change which is a problem in the case of measuring the SQUID. In addition, it is possible to reduce the electric power source load in the case of the application of the correction magnetic field and the load of the cryogenic cooler due to thermal loss which is a problem in the case of the superconducting magnetic shield.

In this embodiment, a structure of a magnetic resonance imaging apparatus using the pulse tube cryogenic cooler of the third embodiment is discussed. However, as the cryogenic cooler provided in the superconducting quantum interference device flux meter, a cryogenic cooler having the regenerative expansion apparatuses for the pulse tube cryogenic cooler of the first and second modified examples of the first embodiment or the regenerative expansion apparatus for the GM cryogenic cooler of the second embodiment can be used.

According to the embodiments of the present invention, it is possible to provide a regenerative expansion apparatus having a magnetic cold storage material in a regenerative cryogenic cooler whereby a magnetic field change due to a magnetic cold storage material can be shielded without causing degradation of a cryogenic cooling capacity of the cryogenic cooler, a pulse tube cryogenic cooler, a magnetic resonance imaging apparatus, a nuclear magnetic resonance apparatus, a superconducting quantum interference device flux meter, and a magnetic shielding method of the regenerative expansion apparatus.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A regenerative expansion apparatus, comprising:
a regenerative tube configured to regenerate cryogenic cooling at the time of expansion of a coolant gas;
a cylinder in communication with a low temperature end of the regenerative tube, the cylinder being configured to generate the cryogenic cooling by repeating compression and expansion of the coolant gas via the regenerative tube;
a magnetic cold storage material filling inside the regenerative tube, the magnetic cold storage material being made of a magnetic material, the magnetic cold storage material being configured to come in contact with the coolant gas so that the cryogenic cooling is regenerated; and
a magnetic shield member surrounding the magnetic cold storage material;
wherein the magnetic shield member has an electric resistivity equal to or less than 50 μΩcm at a normal temperature.

2. The regenerative expansion apparatus as claimed in claim 1,
wherein the magnetic shield member is made of copper or aluminum.

3. The regenerative expansion apparatus as claimed in claim 1,
wherein a part that the magnetic cold storage material of the regenerative tube fills is the magnetic shield member.

4. The regenerative expansion apparatus as claimed in claim 1,
wherein the magnetic shield member comes in contact with and surrounds a part that the magnetic cold storage material of the regenerative tube fills.

5. A pulse tube cryogenic cooler, comprising:
the regenerative expansion apparatus as claimed in claim 1, wherein the cylinder is a pulse tube.

6. A magnetic resonance imaging apparatus, comprising:
the pulse tube cryogenic cooler as claimed in claim 5.

7. A nuclear magnetic resonance apparatus, comprising:
the pulse tube cryogenic cooler as claimed in claim 5.

8. A superconducting quantum interference device flux meter, comprising:
the pulse tube cryogenic cooler as claimed in claim 5.

9. A magnetic shielding method of a regenerative expansion apparatus having a magnetic cold storage material, the method comprising:
a step of flowing a shield electric current through an electric conductance material having an electric resistivity equal to or less than 50 μΩcm at a normal temperature by surrounding the magnetic cold storage material with the electric conductance material so that a magnetic field generated by the magnetic cold storage material is changed and shielded.

* * * * *